US009947639B2

(12) United States Patent
Sawada

(10) Patent No.: US 9,947,639 B2
(45) Date of Patent: Apr. 17, 2018

(54) SEMICONDUCTOR MODULE

(71) Applicant: Sumitomo Electric Industries, Ltd., Osaka-shi (JP)

(72) Inventor: Kenichi Sawada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/511,100

(22) PCT Filed: Sep. 2, 2015

(86) PCT No.: PCT/JP2015/074946
§ 371 (c)(1),
(2) Date: Mar. 14, 2017

(87) PCT Pub. No.: WO2016/059902
PCT Pub. Date: Apr. 21, 2016

(65) Prior Publication Data
US 2017/0278824 A1 Sep. 28, 2017

(30) Foreign Application Priority Data
Oct. 15, 2014 (JP) .................................. 2014-211111

(51) Int. Cl.
*H01L 27/11* (2006.01)
*H01L 25/065* (2006.01)

(52) U.S. Cl.
CPC ................. *H01L 25/0652* (2013.01)

(58) Field of Classification Search
CPC ............. H01L 21/4825; H01L 23/3114; H01L 23/4952; H01L 23/49503; H01L 23/49275; H01L 25/0652
(Continued)

(56) References Cited

U.S. PATENT DOCUMENTS

2001/0015478 A1* 8/2001 Tsunoda ................ H02M 7/003
257/672
2014/0027891 A1* 1/2014 Kimura ............... H01L 23/3107
257/675
2014/0097501 A1 4/2014 Guo et al.

FOREIGN PATENT DOCUMENTS

JP  S52-106564 U  1/1977
JP  S55-137503 U  3/1979
(Continued)

OTHER PUBLICATIONS

International Search Report in counterpart International Application No. PCT/JP2015/074946, dated Nov. 17, 2015.

*Primary Examiner* — Brook Kebede
(74) *Attorney, Agent, or Firm* — Venable LLP; Michael A. Sartori; Laura G. Remus

(57) ABSTRACT

A semiconductor module (10A) according to one embodiment includes a plurality of first and second transistor chips (hereinafter, first and second transistors) (12A, 12B) and a substrate (90). In each of the first and second transistors, first and second main electrode pads (18, 20) are each electrically connected together; the second main electrode pads of the first transistors are electrically connected to the first main electrode pads of the second transistors; control electrode pads of the first and second transistors are respectively connected to first and second control electrode wiring patterns (94, 98) on the substrate via first and second resistance parts (13A, 13B); and the first and second resistance parts respectively have a plurality of first and second resistance elements (72A, 72B) each connected to the corresponding control electrode pad, and first and second linking parts (74A, 74B) respectively linking the plurality of first and second resistance elements together.

15 Claims, 15 Drawing Sheets

(58) Field of Classification Search
USPC .................................................. 257/379, 675
See application file for complete search history.

(56) References Cited

FOREIGN PATENT DOCUMENTS

| | | |
|---|---|---|
| JP | 2002-518858 A | 6/2002 |
| JP | 2005-011986 A | 1/2005 |
| JP | 2013-089948 A | 5/2013 |
| JP | 2013-171870 A | 9/2013 |
| WO | 99/66629 A1 | 12/1999 |

* cited by examiner

SEMICONDUCTOR MODULE

TECHNICAL FIELD

The present invention relates to a semiconductor module.

BACKGROUND ART

A transistor chip that is one of semiconductor devices has a first main electrode pad (for example, a source electrode pad), a second main electrode pad (for example, a drain electrode pad), and a control electrode pad to which a control signal (control voltage) is supplied for controlling conduction between the first main electrode pad and the second main electrode pad. The transistor chip, in which the conduction is controlled between the first main electrode pad and the second main electrode pad according to the control signal supplied to the control electrode pad, functions as a semiconductor switch element. For that reason, the transistor chip is used for a semiconductor module as a power converter such as an inverter, as disclosed in Patent Literature 1, for example.

When the transistor chip is used as a semiconductor switch element in this way, a plurality of transistor chips may be connected together in parallel to be caused to function as a semiconductor switch element. That is, the plurality of transistor chips is connected together in parallel to be formed into a module, and a semiconductor module is configured as a semiconductor switch. In addition, a semiconductor module can be configured functioning as, for example, an inverter by combining the semiconductor modules.

CITATION LIST

Patent Literature

Patent Literature 1: Japanese Unexamined Patent Publication No. 2013-171870

SUMMARY OF INVENTION

Technical Problem

When the transistor is used as a semiconductor switch element, it is necessary to suppress unnecessary oscillation (voltage oscillation) of a control signal in order to achieve switching operation at a higher frequency. For that reason, the control signal may be supplied to the control electrode pad via a resistance element.

When the plurality of transistor chips is connected together in parallel to configure a semiconductor module, in an embodiment provided with a resistance, a resistance element has to be connected to each of the transistor chips. However, usually, since the resistance element has a structure in which a pair of leads (connection terminals) is attached to a resistor, the resistance element hardly stands by itself. For that reason, when connection is attempted of the resistance element to each of the transistor chips without causing misalignment, semiconductor module manufacturing efficiency may be decreased.

Therefore, an object of the present invention is to provide a semiconductor module that can be efficiently manufactured.

Solution to Problem

A semiconductor module according to an aspect of the present invention includes: a substrate; a plurality of first transistor chips mounted on the substrate; and a plurality of second transistor chips mounted on the substrate, wherein: each one of the first transistor chips and the second transistor chips has a first main electrode pad and a second main electrode pad, and a control electrode pad to which a control voltage is supplied for controlling conduction between the first main electrode pad and the second main electrode pad; a first control electrode wiring pattern and a second control electrode wiring pattern are formed on a principal surface of the substrate; the first main electrode pads of the plurality of first transistor chips are electrically connected together; the second main electrode pads of the plurality of first transistor chips are electrically connected together; the first main electrode pads of the plurality of second transistor chips are electrically connected together; the second main electrode pads of the plurality of second transistor chips are electrically connected together; the second main electrode pads of the plurality of first transistor chips are electrically connected to the first main electrode pads of the plurality of second transistor chips; the control electrode pads of the plurality of first transistor chips are connected to the first control electrode wiring pattern via a first resistance part; the control electrode pads of the plurality of second transistor chips are connected to the second control electrode wiring pattern via a second resistance part; the first resistance part has a plurality of first resistance elements each of which is connected to the control electrode pad of each of the first transistor chips, and a first linking part linking the plurality of first resistance elements together; and the second resistance part has a plurality of second resistance elements each of which is connected to the control electrode pad of each of the second transistor chips, and a second linking part linking the plurality of the second resistance elements together.

A semiconductor module according to another aspect of the present invention includes: a substrate; and a plurality of transistor chips mounted on the substrate, wherein: each of the transistor chips has a first main electrode pad and a second main electrode pad, and a control electrode pad to which a control voltage is supplied for controlling conduction between the first main electrode pad and the second main electrode pad; a control electrode wiring pattern is formed on a principal surface of the substrate; the first main electrode pads of the plurality of transistor chips are electrically connected together; the second main electrode pads of the plurality of transistor chips are electrically connected together; the control electrode pads of the plurality of transistor chips are connected to the control electrode wiring pattern via a resistance part; and the resistance part has a plurality of resistance elements each of which is connected to the control electrode pad of each of the transistor chips, and a linking part linking the plurality of resistance elements together.

Advantageous Effects of Invention

According to the present invention, a semiconductor module can be provided that can be efficiently manufactured.

DESCRIPTION OF EMBODIMENTS

Figure 1:
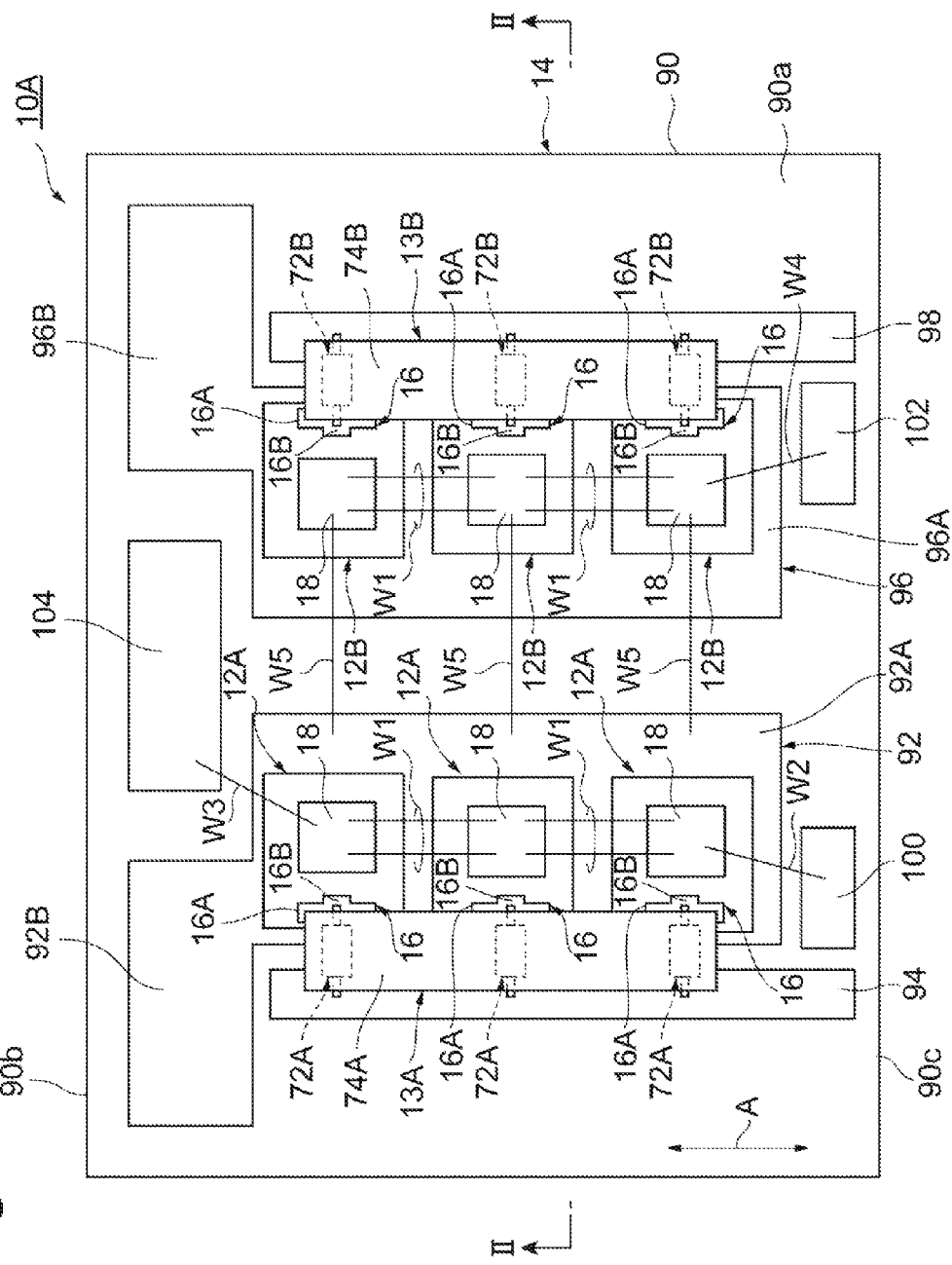
FIG. 1 is a schematic plan view of a semiconductor module according to a first embodiment.

Hereinafter, embodiments of the present invention will be described with reference to the drawings. In the description of the drawings, the same elements will be denoted by the same reference signs, without redundant description. The dimensional ratios in the drawings are not always coincident with those in the description.

Description of Embodiments of the Present Invention

First, details of the embodiments of the present invention are listed and described.

(1) A semiconductor module according to an aspect of the present invention includes: a substrate; a plurality of first transistor chips mounted on the substrate; and a plurality of second transistor chips mounted on the substrate, wherein: each one of the first transistor chips and the second transistor chips has a first main electrode pad and a second main electrode pad, and a control electrode pad to which a control voltage is supplied for controlling conduction between the first main electrode pad and the second main electrode pad; a first control electrode wiring pattern and a second control electrode wiring pattern are formed on a principal surface of the substrate; the first main electrode pads of the plurality of first transistor chips are electrically connected together; the second main electrode pads of the plurality of first transistor chips are electrically connected together; the first main electrode pads of the plurality of second transistor chips are electrically connected together; the second main electrode pads of the plurality of second transistor chips are electrically connected together; the second main electrode pads of the plurality of first transistor chips are electrically connected to the first main electrode pads of the plurality of second transistor chips; the control electrode pads of the plurality of first transistor chips are connected to the first control electrode wiring pattern via a first resistance part; the control electrode pads of the plurality of second transistor chips are connected to the second control electrode wiring pattern via a second resistance part; the first resistance part has a plurality of first resistance elements each of which is connected to the control electrode pad of each of the first transistor chips, and a first linking part linking the plurality of first resistance elements together; and the second resistance part has a plurality of second resistance elements each of which is connected to the control electrode pad of each of the second transistor chips, and a second linking part linking the plurality of the second resistance elements together.

In the semiconductor module described above, the first main electrode pads of the plurality of first transistor chips are electrically connected together, and the second main electrode pads of the plurality of first transistor chips are electrically connected together. For that reason, the plurality of first transistor chips is connected together in parallel. Similarly, the first main electrode pads of the plurality of second transistor chips are electrically connected together, and the second main electrode pads of the plurality of second transistor chips are electrically connected together. For that reason, the plurality of second transistor chips is connected together in parallel.

Since the second main electrode pads of the plurality of first transistor chips are electrically connected to the first main electrode pads of the plurality of second transistor chips, the plurality of first transistor chips connected together in parallel and the plurality of second transistor chips connected together in parallel are connected together in series.

Therefore, for example, when the control voltages are supplied to the respective control electrode pads of the first and second transistor chips, a negative voltage is supplied to the first main electrode pad of each of the first transistor chips, and a positive voltage is supplied to the second main electrode pad of each of the second transistor chips, an inverter circuit can be achieved in which each of the second transistor chips is an upper arm and each of the first transistor chips is a lower arm.

The control electrode pads of the plurality of first transistor chips are connected to the first control electrode wiring pattern via the first resistance part, and the control electrode pads of the plurality of second transistor chips are connected to the second control electrode wiring pattern via the second resistance part. The first resistance part has the plurality of first resistance elements each of which is connected to the control electrode pad of each of the first transistor chips, and the first linking part linking the plurality of first resistance elements together. Similarly, the second resistance part has the plurality of second resistance elements each of which is connected to the control electrode pad of each of the second transistor chips, and the second linking part linking the plurality of second resistance elements together.

For that reason, when the control voltages are supplied to the control electrode pads of the first and second transistor chips respectively via the first and second control electrode wiring patterns, the control voltages are supplied to the control electrode pads of the first and second transistor chips via the respective first and second resistance elements. For that reason, fluctuations of the control voltages supplied to the control electrode pads of the first and second transistor chips can be suppressed by the respective first and second resistance elements.

Further, since the plurality of first resistance elements is integrated together by the first linking part in the first resistance part, the control electrode pads of the plurality of first transistor chips are easily connected to the corresponding first resistance elements. Similarly, since the plurality of second resistance elements is integrated together by the second linking part in the second resistance part, the control electrode pads of the plurality of second transistor chips are easily connected to the corresponding second resistance elements. As a result, the semiconductor module can be efficiently manufactured.

(2) In one embodiment, the first main electrode pad and the control electrode pad of each of the first transistor chips are formed on a front surface of each of the first transistor chips; the second main electrode pad of each of the first transistor chips is formed on a back surface of each of the first transistor chips; the first main electrode pad and the control electrode pad of each of the second transistor chips are formed on a front surface of each of the second transistor chips; the second main electrode pad of each of the second transistor chips is formed on a back surface of each of the second transistor chips; a first chip wiring pattern and a second chip wiring pattern are further formed on the principal surface; each of the plurality of first transistor chips is mounted on the first chip wiring pattern such that the second main electrode pad faces the principal surface, and the second main electrode pad is connected to the first chip wiring pattern; each of the plurality of second transistor chips is mounted on the second chip wiring pattern such that the second main electrode pad faces the principal surface, and the second main electrode pad is connected to the second chip wiring pattern; and the first main electrode pads of the plurality of second transistor chips are electrically connected to the first chip wiring pattern.

In this embodiment, each of the first and second transistor chips is a vertical transistor chip. Each of the first and second transistor chips is mounted on the substrate such that its back surface faces the principal surface of the substrate, so that the second main electrode pad of each of the first transistor chips and the second main electrode pad of each of the second transistor chips are respectively connected to the first chip wiring pattern and the second chip wiring pattern. Thus, the second main electrode pads of the plurality of first transistor chips are electrically connected together, and the second main electrode pads of the plurality of second transistor chips are electrically connected together. Since the first main electrode pads of the plurality of second transistor chips are electrically connected to the first chip wiring pattern, the plurality of first transistor chips connected together in parallel and the plurality of second transistor chips connected together in parallel are connected together in series.

(3) In one embodiment, the plurality of first transistor chips may be arranged in a first predetermined direction on the substrate, and the control electrode pad of each of the first transistor chips may extend in the first predetermined direction.

In this case, since the plurality of first transistor chips is arranged in the first predetermined direction, when the control electrode pad of each of the first transistor chips is connected to the first control electrode wiring pattern via the first resistance part (specifically, the corresponding first resistance element), the plurality of first resistance elements is also arranged in the first predetermined direction to the respective first transistor chips. Since the control electrode pad of each of the first transistor chips extends in the predetermined direction, when the corresponding first resistance element is connected to the control electrode pad, misalignment is reduced of the first resistance element to the control electrode pad.

(4) In one embodiment, each of the first transistor chips may have: a cell portion having a transistor structure including a first main electrode and a second main electrode electrically connected respectively to the first main electrode pad and the second main electrode pad included in each of the first transistor chips, and a control electrode electrically connected to the control electrode pad included in each of the first transistor chips; and a circumferential portion surrounding the cell portion and electrically protecting the cell portion, and at least a part of the control electrode pad included in each of the first transistor chips may be provided on the circumferential portion.

In this case, each of the first transistor chips has the cell portion that is a region in which a current flows in a conduction state between the first and second main electrode pads, and the circumferential portion surrounding the cell portion. The circumferential portion is a region electrically protecting the cell portion, and a region not substantially contributing to transistor operation. At least a part of the control electrode pad is provided on the circumferential portion. For that reason, even when the control electrode pad extends in the predetermined direction, a larger region of the cell portion can be secured.

(5) In one embodiment, the plurality of second transistor chips may be arranged in a second predetermined direction on the substrate, and the control electrode pad of each of the second transistor chips may extend in the second predetermined direction.

In this case, since the plurality of second transistor chips is arranged in the second predetermined direction, when the control electrode pad of each of the second transistor chips is connected to the second control electrode wiring pattern via the second resistance part (specifically, the corresponding second resistance element), the plurality of second resistance elements is also arranged in the second predetermined direction for the second transistor chips. Since the control electrode pad of each of the second transistor chips extends in the predetermined direction, when the corresponding second resistance element is connected to the control electrode pad, misalignment is reduced of the second resistance element to the control electrode pad.

(6) In one embodiment, each of the second transistor chips may have: a cell portion having a transistor structure including a first main electrode and a second main electrode electrically connected respectively to the first main electrode pad and the second main electrode pad included in each of the second transistor chips, and a control electrode electrically connected to the control electrode pad included in each of the second transistor chips; and a circumferential portion surrounding the cell portion and electrically protecting the cell portion, and at least a part of the control electrode pad included in each of the second transistor chips may be provided on the circumferential portion.

In this case, each of the second transistor chips has the cell portion that is a region in which a current flows in a conduction state between the first and second main electrode pads, and a circumferential portion surrounding the cell portion. The circumferential portion is a region electrically protecting the cell portion, and a region not substantially contributing to transistor operation. At least a part of the control electrode pad is provided on the circumferential portion. For that reason, even when the control electrode pad extends in the predetermined direction, a larger region of the cell portion can be secured.

(7) In one embodiment, each of the first resistance elements and the corresponding control electrode pad may be physically connected together, and each of the first resistance elements and the first control electrode wiring pattern may be physically connected together.

In this case, since a conducting wire is not necessary when the control electrode pad of each of the first transistor chips and the first control electrode wiring pattern are connected together via the first resistance part, an inductance component due to such a conducting wire does not occur. As a result, fluctuation of the control voltage supplied to the control electrode pad hardly occurs, and the semiconductor module can be driven at a high frequency.

(8) In one embodiment, each of the second resistance elements and the corresponding control electrode pad may be physically connected together, and each of the second resistance elements and the second control electrode wiring pattern may be physically connected together.

In this case, since a conducting wire is not necessary when the control electrode pad of each of the second transistor chips and the second control electrode wiring pattern are connected together via the second resistance part, an inductance component due to such a conducting wire does not occur. As a result, fluctuation of the control voltage supplied to the control electrode pad hardly occurs, and the semiconductor module can be driven at a high frequency.

(9) In one embodiment, each one of the first transistor chips and the second transistor chips may include a wide band gap semiconductor. A transistor chip using a wide band gap semiconductor tends to be smaller than a transistor chip using silicon. Even in such a case, as described above, the plurality of first transistor chips is connected together in parallel, and the plurality of second transistor chips is connected together in parallel, so that a larger current is easily allowed to flow through the semiconductor module.

(10) A semiconductor module according to another aspect of the present invention includes: a substrate; and a plurality of transistor chips mounted on the substrate, wherein: each of the transistor chips has a first main electrode pad and a second main electrode pad, and a control electrode pad to which a control voltage is supplied for controlling conduction between the first main electrode pad and the second main electrode pad; a control electrode wiring pattern is formed on a principal surface of the substrate; the first main electrode pads of the plurality of transistor chips are electrically connected together; the second main electrode pads of the plurality of transistor chips are electrically connected together; the control electrode pads of the plurality of transistor chips are connected to the control electrode wiring pattern via a resistance part; and the resistance part has a plurality of resistance elements each of which is connected to the control electrode pad of each of the transistor chips, and a linking part linking the plurality of resistance elements together.

In the semiconductor module described above, the first main electrode pads of the plurality of transistor chips are electrically connected together, and the second main electrode pads of the plurality of transistor chips are electrically connected together. For that reason, the plurality of transistor chips is connected together in parallel.

Therefore, for example, the control voltage is supplied to the control electrode pad of each of the transistor chips, a negative voltage is supplied to one of the first main electrode pad and the second main electrode pad of each of the transistor chips, and a positive voltage is supplied to the other, so that the semiconductor module can be caused to function as a semiconductor switch.

The control electrode pads of the plurality of transistor chips are connected to the control electrode wiring pattern via the resistance part. The resistance part has the plurality of resistance elements each of which is connected to the control electrode pad of each of the transistor chips, and the linking part linking the plurality of resistance elements together.

Therefore, when the control voltage is supplied to the control electrode pad of each of the transistor chips via the control electrode wiring pattern, the control voltage is supplied to the control electrode pad of the transistor chips via each of the resistance elements. For that reason, fluctuation of the control voltage supplied to the control electrode pad of each of the transistor chips can be suppressed by each of the resistance elements.

Further, the plurality of resistance elements is integrated together by the linking part in the resistance part. For that reason, the control electrode pads of the plurality of transistor chips are easily connected to the corresponding resistance elements. As a result, the semiconductor module can be efficiently manufactured.

(11) In one embodiment, the first main electrode pad and the control electrode pad of each of the transistor chips may be formed on a front surface of each of the transistor chips, the second main electrode pad of each of the transistor chips may be formed on a back surface of each of the transistor chips, a chip wiring pattern on which the plurality of the transistor chips is mounted may be further formed on the principal surface, and each of the plurality of transistor chips may be mounted on the chip wiring pattern such that the second main electrode pad faces the principal surface.

In this embodiment, each of the transistor chips is a vertical transistor chip. Each of the transistor chips is mounted on the substrate such that its back surface faces the principal surface of the substrate, so that the second main electrode pad is connected to the chip wiring pattern. Thus, the second main electrode pads of the plurality of transistor chips are electrically connected together.

(12) In one embodiment, the plurality of transistor chips may be arranged in a predetermined direction on the substrate, and the control electrode pad of each of the transistor chips may extend in the predetermined direction.

In this case, since the plurality of transistor chips is arranged in the predetermined direction, when the control electrode pad of each of the transistor chips is connected to the control electrode wiring pattern via the resistance part (specifically, the corresponding resistance element), the plurality of resistance elements is also arranged in the predetermined direction for the transistor chips. Since the control electrode pad of each of the transistor chips extends in the predetermined direction, when the corresponding resistance element is connected to the control electrode pad, misalignment is reduced of the resistance element to the control electrode pad.

(13) In one embodiment, each of the transistor chips may have: a cell portion having a transistor structure including a first main electrode and a second main electrode electrically connected respectively to the first main electrode pad and the second main electrode pad, and a control electrode electrically connected to the control electrode pad; and a circumferential portion surrounding the cell portion and electrically protecting the cell portion, and at least a part of the control electrode pad may be provided on the circumferential portion.

In this case, each of the transistor chips has the cell portion that is a region in which a current flows in a conduction state between the first and second main electrode pads, and the circumferential portion surrounding the cell portion. The circumferential portion is a region electrically protecting the cell portion, and a region not substantially contributing to transistor operation. At least a part of the control electrode pad is provided on the circumferential portion. For that reason, even when the control electrode pad extends in the predetermined direction, a larger region of the cell portion can be secured.

(14) In one embodiment, each of the resistance elements and the corresponding control electrode pad may be physically connected together, and each of the resistance elements and the control electrode wiring pattern may be physically connected together.

In this case, since a conducting wire is not necessary when the control electrode pad of each of the transistor chips and the control electrode wiring pattern are connected together via the resistance part, an inductance component due to such a conducting wire does not occur. As a result, fluctuation of the control voltage supplied to the control electrode pad hardly occurs, and the semiconductor module can be driven at a high frequency.

(15) In one embodiment, each of the transistor chips may include a wide band gap semiconductor. A transistor chip using a wide band gap semiconductor tends to be smaller than a transistor chip using silicon. As described above, the plurality of transistor chips is connected together in parallel, whereby a larger current is easily caused to flow through the semiconductor module.

Details of Embodiments of the Present Invention

Specific examples of the semiconductor module according to embodiments of the present invention will be described below with reference to the drawings. The present invention is not limited to these exemplifications, and it is intended that all modifications are included indicated by the claims, and within a scope and meaning equivalent to the claims. In the description of the drawings, the same elements will be denoted by the same reference signs, without redundant description. The dimensional ratios in the drawings are not always coincident with those in the description.

<1> First Embodiment

Figure 2:
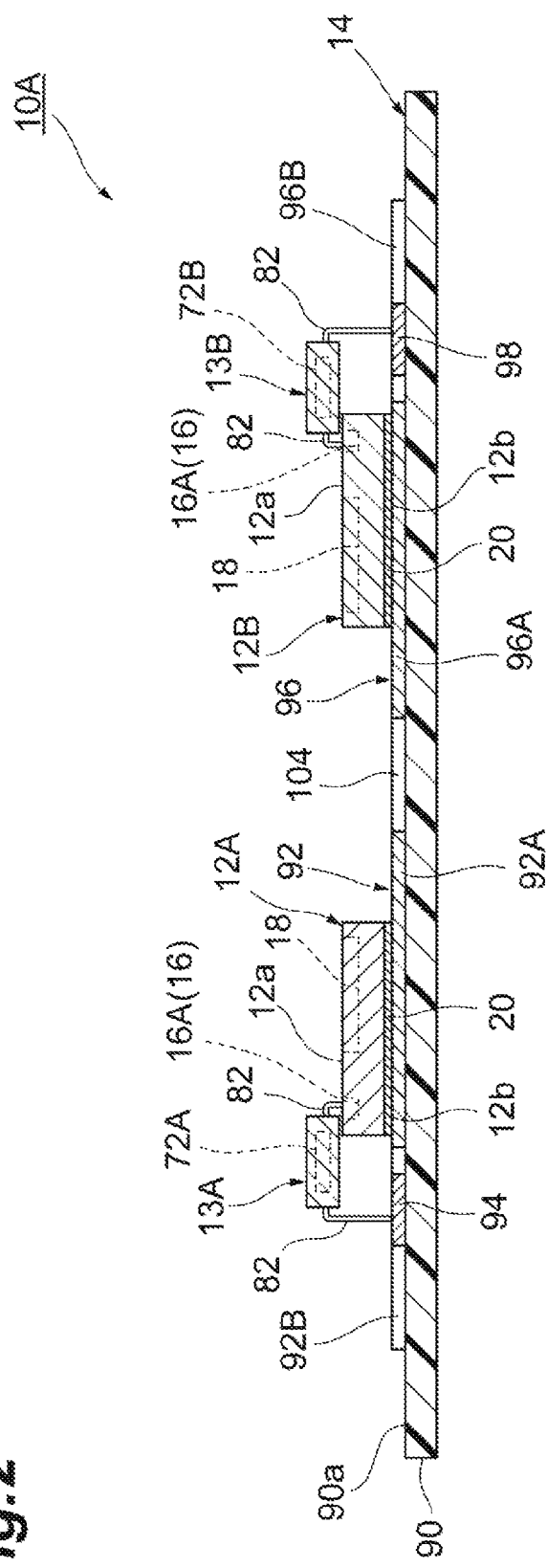
FIG. 2 is a schematic view of a cross section along a line II-II of FIG. 1.

A semiconductor module 10A according to a first embodiment includes a plurality of first transistor chips 12A (three in FIG. 1), a plurality of second transistor chips 12B (three in FIG. 1), a first resistance part 13A, a second resistance part 13B, and a wiring substrate 14, as illustrated in FIG. 1 and FIG. 2. The semiconductor module 10A is a single phase inverter as a power converter. In FIG. 2, illustration of a wire for wiring described later is omitted.

The plurality of first transistor chips 12A is electrically connected together in parallel, and configures a first semiconductor switch part as a lower arm in the power converter. The plurality of second transistor chips 12B is electrically connected together in parallel, and configures a second semiconductor switch part as an upper arm. The first and second semiconductor switch parts are connected together in series.

<1.1> First and Second Transistor Chips 12A, 12B

The first and second transistor chips 12A, 12B will be described with reference to FIG. 3, FIG. 4(a), FIG. 4(b), and FIG. 4(c). The configurations of the first and second transistor chips 12A, 12B are the same as each other. For that reason, the configurations of the first and second transistor chips 12A, 12B will be described by referring to the first and second transistor chips 12A, 12B as a transistor chip 12.

For description, two directions substantially orthogonal to the thickness direction of the transistor chip 12 (the normal direction of a front surface of a semiconductor substrate 42 described later) are respectively referred to as the x-axis direction and the y-axis direction, as illustrated in FIG. 3, FIG. 4(a), FIG. 4(b), and FIG. 4(c).

Figure 3:
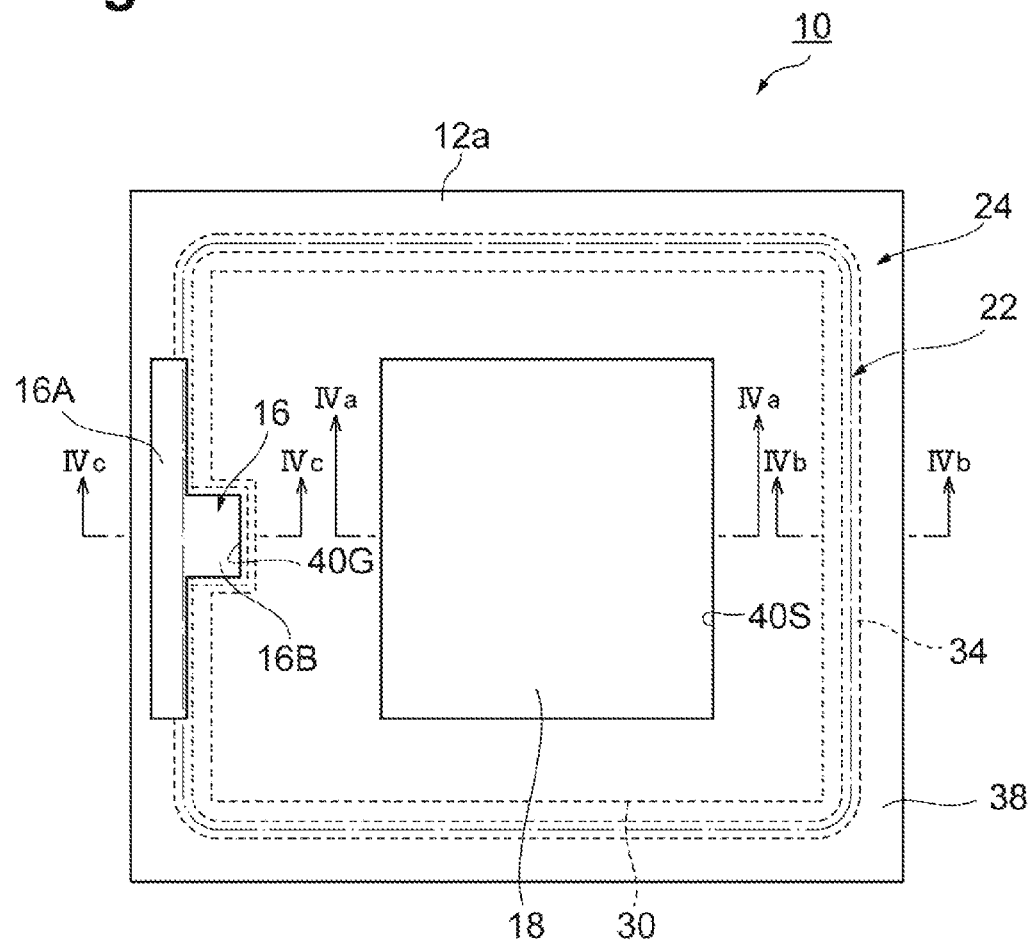
FIG. 3 is a schematic plan view for describing first and second transistors included in the semiconductor module illustrated in FIG. 1.
Figure 4:
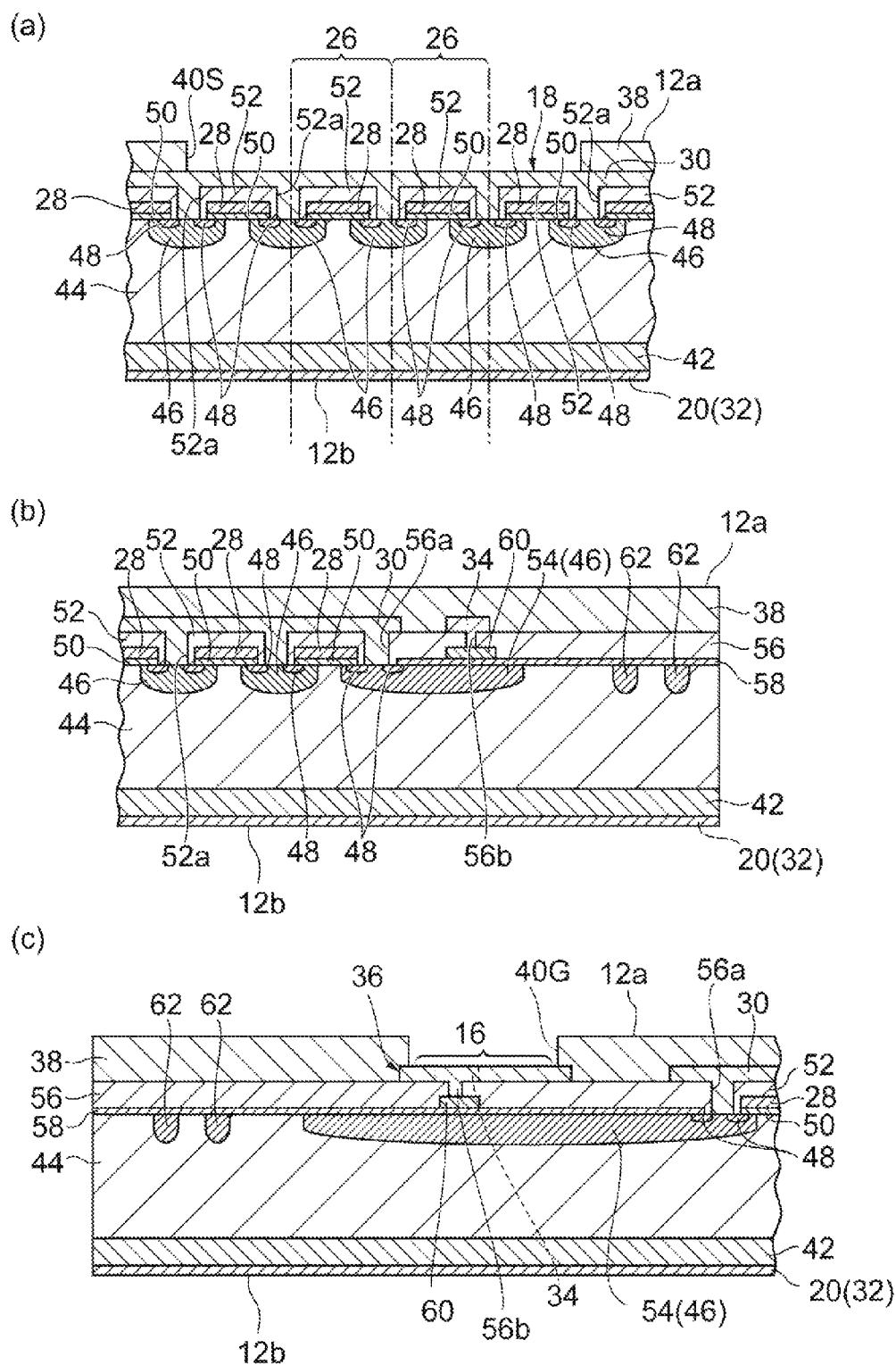
FIG. 4(a) is a schematic view of a cross section along a line IVa-IVa of FIG. 3.
FIG. 4(b) is a schematic view of a cross section along a line IVb-IVb of FIG. 3.
FIG. 4(c) is a schematic view of a cross section along a line IVc-IVc of FIG. 3.

The transistor chip 12 is a vertical metal-oxide-semiconductor field-effect transistor (MOSFET) in which a gate electrode pad (control electrode pad) 16 and a source electrode pad (first main electrode pad) 18 are formed on a front surface 12a, as illustrated in FIG. 3, and a drain electrode pad (second main electrode pad) 20 is formed on a back surface 12b, as illustrated in FIG. 4(a) to FIG. 4(c). The gate electrode pad 16 is an electrode pad to which a gate voltage (control voltage) is supplied as a signal (gate signal) for controlling a conduction state between the source electrode pad 18 and the drain electrode pad 20. An example of a semiconductor material of the transistor chip 12 is a wide band gap semiconductor, and an example of the wide band gap semiconductor includes SiC and GaN.

An example of a shape in a plan view of the transistor chip 12 (a shape viewed from the thickness direction of the transistor chip 12) is a substantially quadrilateral shape, as illustrated in FIG. 3. The example of the substantially rectangular shape includes a square and a rectangle. When the shape in a plan view of the transistor chip 12 is a substantially square, the transistor chip 12 has a cell portion 22, and a circumferential portion 24 surrounding the cell portion 22. In FIG. 3, the cell portion 22 is a region surrounded by the one-dot chain line, and the circumferential portion 24 is a portion outside the region surrounded by the one-dot chain line.

A shape in a plan view of the cell portion 22 can be a shape similar to the shape in a plan view of the transistor chip 12. The shape in a plan view of the cell portion 22 will be described as a substantially square in the first embodiment. An example of the length of one side of the cell portion 22 is 20 µm or less.

The cell portion 22 is configured by a plurality of unit cells 26 arranged in parallel, as illustrated in FIG. 4(a). Adjacent unit cells 26 are physically arranged contiguously in parallel. In this embodiment, the cell portion 22 is an active portion in which a main current flows in a channel region.

In one embodiment, the cell portion 22 can be configured by the plurality of unit cells 26 whose shape in a plan view is a quadrilateral shape connected together in parallel in an array. In one embodiment, each of the unit cells 26 can have a stripe shape extending in one direction. In this case, the cell portion 22 can have the configuration in which the plurality of unit cells 26 is connected together in parallel in a direction in which each of the unit cells 26 is orthogonal to an extending direction of each of the unit cells 26.

The unit cells 26 each have a vertical transistor structure including a gate electrode (control electrode) 28, a source electrode (first main electrode) 30, and a drain electrode (second main electrode) 32, specifically, a MOSFET structure, and are partitioned with reference to the gate electrode 28. In the transistor chip 12, the source electrode 30 and the drain electrode 32 are shared between the plurality of unit cells 26.

Specifically, a part of the source electrode 30 provided on the front surface 12a side of the transistor chip 12 functions as the source electrode in each of the unit cells 26, and a part of the drain electrode 32 provided on the back surface 12b side of the transistor chip 12 functions as the drain electrode in each of the unit cells 26. The drain electrode 32 that is common in the plurality of unit cells 26 corresponds to the drain electrode pad 20.

However, the source electrode 30 and the drain electrode 32 may be provided for each of the unit cells 26. In this case, it is sufficient that the source electrode pad 18 is electrically connected to the source electrode 30 for each of the unit cells 26. Similarly, it is sufficient that the drain electrode pad 20 is electrically connected to the drain electrode 32 for each of the unit cells 26.

A gate electrode wiring (control electrode wiring) 34 is provided along the outer edge of the cell portion 22 (the edge illustrated by the one-dot chain line in FIG. 3) in the cell portion 22. That is, the gate electrode wiring (control electrode wiring) 34 is arranged annularly.

The gate electrode wiring 34 is electrically connected to the gate electrode 28 of each of the unit cells 26, and is also referred to as a gate runner. A pad electrode 36 is provided to a part of the gate electrode wiring 34.

A passivation film 38 is formed as a protective film for covering the source electrode 30 and the gate electrode wiring 34, on the front surface 12a of the transistor chip 12. In the transistor chip 12, a gate opening portion 40G and a source opening portion 40S are formed in the passivation film 38 on the pad electrode 36 and the source electrode 30.

The gate electrode pad 16 has a resistance connection region 16A extending in one direction (the y-axis direction in FIG. 3), as illustrated in FIG. 3. In one embodiment, at least a part of the resistance connection region 16A may be provided on the circumferential portion 24. For example, the resistance connection region 16A may protrude from the outer edge of the cell portion 22 toward the circumferential portion 24 side, as illustrated in FIG. 3.

In one embodiment, the gate electrode pad 16 may have a probe connection region 16B provided to be protruded at a part in an extending direction of the resistance connection region 16A. The probe connection region 16B is a region to which an inspection probe is connected for inspecting the transistor chip 12. The probe connection region 16B may protrude from the outer edge of the cell portion 22 toward the inside of the cell portion 22, for example, as illustrated in FIG. 3.

A portion of the pad electrode 36 exposed through the gate opening portion 40G is the gate electrode pad 16, as illustrated in FIG. 3, FIG. 4(a), and FIG. 4(c). Similarly, a portion of the source electrode 30 exposed through the source opening portion 40S is the source electrode pad 18.

The configuration of the transistor chip 12 will be described in more details with reference to FIG. 4(a) to FIG. 4(c). First, the configuration common to the cell portion 22 and the circumferential portion 24 will be described. In the following description, a conductivity type of the semiconductor, material, and the like are examples for the description.

The transistor chip 12 has the n-type (first conductivity type) semiconductor substrate 42. An example of a material of the semiconductor substrate 42 is a wide band gap semiconductor. An example of the thickness of the semiconductor substrate 42 is 400 μm.

The drain electrode 32 is provided on the back surface of the semiconductor substrate 42. An example of the drain electrode 32 is a metal film such as a Ni film. An n-type drift layer 44 is provided as an underlying semiconductor layer on the front surface of the semiconductor substrate 42. An example of a material of the drift layer 44 can be the same as the material of the semiconductor substrate 42. An example of the n-type dopant concentration in the drift layer 44 is about $5\times10^{16}$ cm$^{-3}$. An example of the thickness of the drift layer 44 is about 10 μm.

Next, the configurations of the cell portion 22 and the circumferential portion 24 on the semiconductor substrate 42 will be described. First, for the cell portion 22, the configuration of the lower side of the source electrode 30 will be mainly described mainly with reference to FIG. 4(a). The configuration in the vicinity of the outer edge of the cell portion 22 will be described later.

In the surface part of the drift layer 44, a plurality of first p-type (second conductivity type) semiconductor regions 46 is formed apart from each other, as p-body regions. A material of the first p-type semiconductor regions 46 can be the same as the material of the semiconductor substrate 42. An example of the p-type dopant concentration of the first p-type semiconductor regions 46 is about $5\times10^{17}$ cm$^{-3}$. An example of the thickness (or the depth) of the first p-type semiconductor regions 46 is about 1.0 μm.

When the shape in a plan view of each of the unit cells 26 is angular, each of the first p-type semiconductor regions 46 can be formed in an island shape in the surface part of the drift layer 44. When each of the unit cells 26 extends in one direction, each of the first p-type semiconductor regions 46 can also extend in the one direction.

Two n-type source regions 48 are formed apart from each other, in each of the first p-type semiconductor regions 46. An example of the n-type dopant concentration in each of the source regions 48 is about $1\times10^{19}$ cm$^{-3}$. An example of the thickness (or the depth) of each of the source regions 48 is about 0.3 μm.

A gate insulating film 50 and the gate electrode 28 are layered on a region between the adjacent first p-type semiconductor regions 46, 46 in the front surface of the drift layer 44. The gate insulating film 50 and the gate electrode 28 are arranged on the region between the adjacent first p-type semiconductor regions 46, 46 to form a MOS structure with the source regions 48 in each of the first p-type semiconductor regions 46.

The gate insulating film 50 and the gate electrode 28 can be provided for each of the unit cells 26, in the first embodiment. An example of the gate insulating film 50 is a silicon oxide film. An example of the thickness of the gate insulating film 50 is about 50 μm. An example of the gate electrode 28 is a metal film such as an Al film.

A bump portion formed of the gate insulating film 50 and the gate electrode 28 is covered with a first interlayer insulating film 52. An example of the first interlayer insulating film 52 is a silicon oxide film.

The source electrode 30 is provided on the first interlayer insulating film 52. An example of the source electrode 30 is a metal film such as a nickel (Ni) film. An example of the thickness of the source electrode 30 is about 0.1 µm. A first contact region 52a such as a contact hole is formed in the first interlayer insulating film 52 so that each of the source regions 48 and the source electrode 30 are electrically in contact with each other.

In the configuration described above, each of the unit cells 26 has a vertical MOSFET structure and a double diffusion MOSFET structure.

Specifically, when viewed from the gate electrode 28 as a reference, each of the unit cells 26 has the semiconductor substrate 42 and the drain electrode 32 provided on the back surface of the semiconductor substrate 42. Each of the unit cells 26 includes the drift layer 44 provided on the front surface of the semiconductor substrate 42, the first p-type semiconductor regions 46 formed on the surface part of the drift layer 44 and apart from each other, the source regions 48 formed in each of the first p-type semiconductor regions 46, the gate insulating film 50 and the gate electrode 28 forming the MOS structure with the source regions 48, and the source electrode 30 electrically connected to the source regions 48 and insulated from the gate electrode 28.

Next, the configuration in the vicinity of the outer edge of the cell portion 22 on which the gate electrode wiring 34 is formed will be described mainly with reference to FIG. 4(b) and FIG. 4(c).

The first p-type semiconductor region 46 as a p-body region is formed along the outer edge of the cell portion 22, in the surface part of the drift layer 44. Hereinafter, for convenience of description, the first p-type semiconductor region 46 formed along the outer edge of the cell portion 22 is also referred to as a second p-type semiconductor region 54.

In one embodiment, the second p-type semiconductor region 54 protrudes from the cell portion 22 toward the circumferential portion 24 side to the outside of the cell portion 22, in order to obtain the breakdown voltage characteristic of the transistor chip 12. In the end portion which is located on the cell portion 22 center side in the second p-type semiconductor region 54, the source regions 48 configuring a part of the unit cell 26, and the source regions 48, are formed apart from each other.

An insulating film 58 covered by the second interlayer insulating film 56 is provided on the second p-type semiconductor region 54. The materials and thicknesses of the insulating film 58 and the second interlayer insulating film 56 can be the same as those of the gate insulating film 50 and the first interlayer insulating film 52, respectively. The end portion of the cell portion 22 center side of the second interlayer insulating film 56 is covered by a part of the source electrode 30.

In the second interlayer insulating film 56, a second contact region 56a is formed penetrating the second interlayer insulating film 56, in order to electrically connect each of the source regions 48 and the source electrode 30 together in the second p-type semiconductor region 54.

A conductive gate wiring member 60, provided along the outer edge of the cell portion 22, is buried in the second interlayer insulating film 56. The thickness and material of the gate wiring member 60 can be similar to those of the gate electrode 28. The gate wiring member 60 is electrically connected to each gate electrode 28.

The gate electrode wiring 34 is provided on the second interlayer insulating film 56 in a direction in which the gate wiring member 60 extends, that is, along the outer edge of the cell portion 22. A third contact region 56b, penetrating through the second interlayer insulating film 56 to the gate electrode wiring 34, is formed in the second interlayer insulating film 56.

The gate electrode wiring 34 is electrically connected to the gate wiring member 60 via the third contact region 56b. As a result, the gate electrode wiring 34 is electrically connected to the gate electrode 28 of each of the unit cells 26. An example of the gate electrode wiring 34 can be the same as the example of the source electrode 30.

In a part of the gate electrode wiring 34, for example, in a part of a region extending in the y-axis direction of the gate electrode wiring 34 arranged in a substantially quadrilateral shape as illustrated in FIG. 3, the pad electrode 36 is provided, as illustrated in FIG. 4(c). The pad electrode 36 can be formed by forming a part of the gate electrode wiring 34 to have a wide width. In FIG. 4(c), the pad electrode 36 is formed by widening a part of the gate electrode wiring 34 to both of the cell portion 22 and circumferential portion 24 sides.

The configuration of the circumferential portion 24 will be described, further with reference to FIG. 4(b) and FIG. 4(c). In the circumferential portion 24, the insulating film 58 and the second interlayer insulating film 56 are layered in order, on the drift layer 44. Here, the circumferential portion 24 includes the insulating film 58 and the second interlayer insulating film 56; however, it is sufficient that the circumferential portion 24 includes the drift layer 44.

The drift layer 44 common to the cell portion 22 is included, so that a depletion layer at a revers bias is more easily widened, and the breakdown voltage characteristic can be obtained. In this case, the circumferential portion 24 functions as a peripheral breakdown resistant part for securing the breakdown voltage characteristic.

In circumferential portion 24, the second p-type semiconductor region 54 can protrude from the cell portion 22 side, as described above. Due to the protruding second p-type semiconductor region 54 in this way, the depletion layer at a reverse bias is easily widened further uniformly. For that reason, the breakdown voltage characteristic in the transistor chip 12 can be secured more. In addition, a trench-shaped third p-type semiconductor region 62 may be provided in the drift layer 44 included in the circumferential portion 24, in order to further secure the breakdown voltage characteristic. The p-type dopant concentration and thickness of the third p-type semiconductor region 62 can be similar to those of the first p-type semiconductor region 46.

The front surface of the layered structure described above formed on the front surface of the semiconductor substrate 42 is covered by the passivation film 38, as illustrated in FIG. 4(a) to FIG. 4(c). The gate opening portion 40G is formed in the passivation film 38 on the pad electrode 36. A portion in which the pad electrode 36 is exposed through the gate opening portion 40G is the gate electrode pad 16.

The source opening portion 40S is formed also in the passivation film 38 on the source electrode 30. A portion in which the source electrode 30 is exposed through the source opening portion 40S is the source electrode pad 18. An example of the passivation film 38 is a SiN film. An example of the thickness of the passivation film 38 is 10 µm.

Next, an example of a method for manufacturing the transistor chip 12 will be described with reference to FIG. 5(a) to FIG. 5(f) and FIG. 6(a) to FIG. 6(e). In FIG. 5(a) to FIG. 5(f) and FIG. 6(a) to FIG. 6(e), a manufacturing process in the vicinity of the configuration illustrated in FIG. 4(c) is illustrated.

Figure 5:
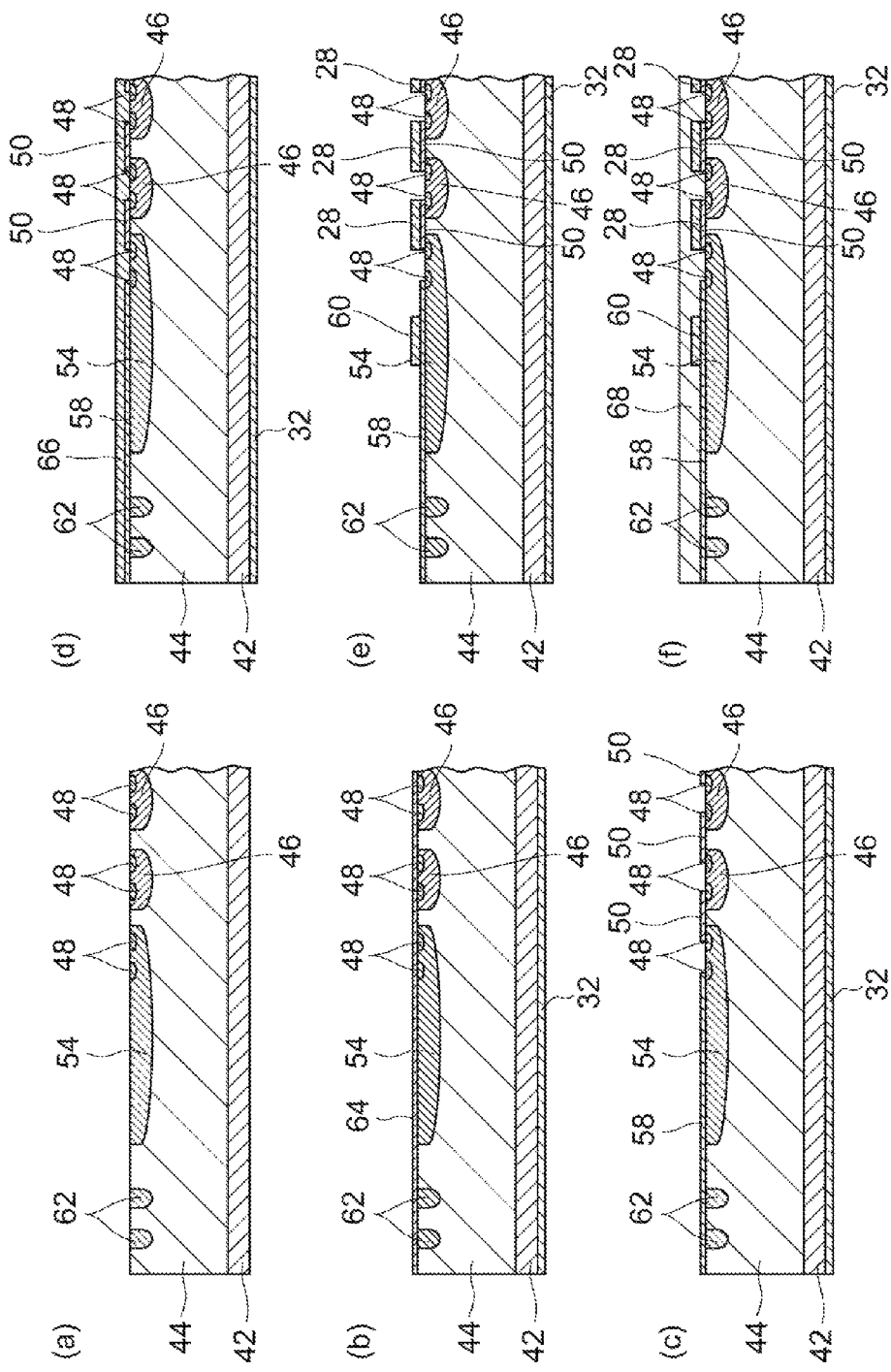
FIG. 5(a) is a schematic view illustrating a process of a method for manufacturing the semiconductor module illustrated in FIG. 1.
FIG. 5(b) is a schematic view illustrating a process subsequent to FIG. 5(a)
FIG. 5(c) is a schematic view illustrating a process subsequent to FIG. 5(b)
FIG. 5(d) is a schematic view illustrating a process subsequent to FIG. 5(c)
FIG. 5(e) is a schematic view illustrating a process subsequent to FIG. 5(d)
FIG. 5(f) is a schematic view illustrating a process subsequent to FIG. 5(e).

The drift layer 44 is formed on the front surface of the semiconductor substrate 42 formed of an n-type SiC substrate, and then the first and second p-type semiconductor regions 46, 54 and the source regions 48 are formed in the surface part of the drift layer 44, as illustrated in FIG. 5(a). When the third p-type semiconductor region 62 is formed, the third p-type semiconductor region 62 is formed together with the second p-type semiconductor region 46 and the like. In the following, an embodiment including the third p-type semiconductor region 62 will be described.

Specifically, the drift layer 44 is formed as an epitaxial growth layer on the front surface of the semiconductor substrate 42 by a CVD epitaxial growth method with in-situ doping.

A recess portions are formed to be the first to third p-type semiconductor regions 46, 54, 62 at predetermined positions of the drift layer 44 by reactive ion etching (RIE) and the like. After that, the first to third p-type semiconductor regions 46, 54, 62 are epitaxially grown on a bottom surface and a side surface of each of the recess portions by the CVD epitaxial growth method with in-situ doping. In this case, each of the first to third p-type semiconductor regions 46, 54, 62 is a selective embedded growth region.

The plurality of source regions 48 is formed on the first and second p-type semiconductor regions 46, 54 by performing ion injection using an injection mask.

Then, a silicon oxide film 64 is deposited as an insulating film on the drift layer 44 by, for example, CVD method, as illustrated in FIG. 5(b). After that, the drain electrode 32 is formed of a Ni film on the back surface of the semiconductor substrate 42 by an evaporation method, a sputtering method, or the like.

After that, the gate insulating film 50 and the insulating film 58 are formed by patterning the silicon oxide film 64, as illustrated in FIG. 5(c). Subsequently, an Al film 66 is formed on the semiconductor substrate 42 by, for example, CVD method, as illustrated in FIG. 5(d).

The gate electrode 28 and the gate wiring member 60 are formed by patterning the Al film 66, as illustrated in FIG. 5(e).

After that, a second silicon oxide film 68 is deposited further on the semiconductor substrate 42 by, for example, CVD method, to bury the gate electrode 28 and the gate wiring member 60, as illustrated in FIG. 5(f). The second silicon oxide film 68 is the first interlayer insulating film 52 in the cell portion 22, and is the second interlayer insulating film 56 in the circumferential portion 24.

Figure 6:
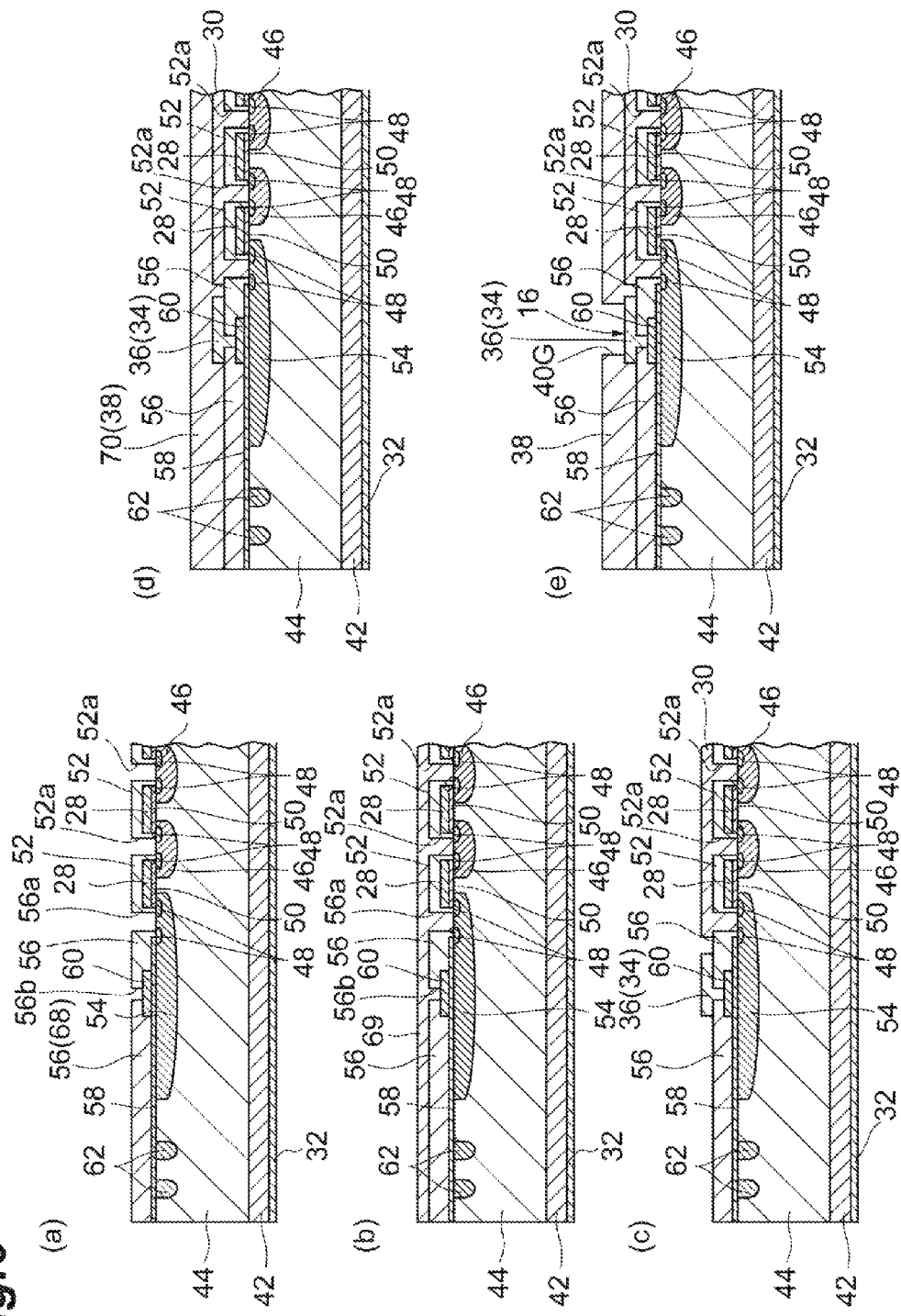
FIG. 6(a) is a schematic view illustrating a process subsequent to FIG. 5(f) in the method for manufacturing the semiconductor module illustrated in FIG. 1.
FIG. 6(b) is a schematic view illustrating a process subsequent to FIG. 6(a)
FIG. 6(c) is a schematic view illustrating a process subsequent to FIG. 6(b)
FIG. 6(d) is a schematic view illustrating a process subsequent to FIG. 6(c)
FIG. 6(e) is a schematic view illustrating a process subsequent to FIG. 6(d).

Subsequently, the first to third contact regions 52a, 56a, 56b are formed in the second silicon oxide film 68, in order to secure electrical contact between each of the source regions 48 and the source electrode 30 and electrical contact between the gate wiring member 60 and the gate electrode wiring 34, as illustrated in FIG. 6(a). The first to third contact regions 52a, 56a, 56b can be formed by using etching and the like.

A Ni film 69 is deposited by, for example, CVD method, on the semiconductor substrate 42 having the second silicon oxide film 68 (the first interlayer insulating film 52 and the second interlayer insulating film 56) on which the first to third contact regions 52a, 56a, 56b are formed, as illustrated in FIG. 6(b). The source electrode 30 and the gate electrode wiring 34 are formed by patterning the Ni film 69, as illustrated in FIG. 6(c). At this time, the pad electrode 36 is formed by forming the gate electrode wiring 34 to have a wide width at a forming position of the gate electrode pad 16. FIG. 6(c) illustrates the gate electrode wiring 34 to which the pad electrode 36 is formed. The pad electrode 36 may be formed in a shape according to the shape of the gate electrode pad 16.

Here, the semiconductor substrate 42 is subjected to heat treatment, so that contact is changed from schottky contact to ohmic contact between nickel (Ni) configuring the source electrode 30 and the drain electrode 32 and SiC configuring the source region 48 and the semiconductor substrate 42.

A SiN film 70 is formed by, for example, CVD method, on the semiconductor substrate 42 on which the source electrode 30 is formed, as illustrated in FIG. 6(d). The SiN film 70 is the passivation film 38.

The gate opening portion 40G and the source opening portion 40S are formed in the passivation film 38 to form the gate electrode pad 16 and the source electrode pad 18.

Here, materials and methods for forming the films have been described with some examples of the semiconductor substrate 42, the gate electrode 28, the source electrode 30, the drain electrode 32, and the like; however, the materials and the methods for forming the films of the components configuring the transistor chip 12 are not limited to those exemplified.

<2.2> First and Second Resistance Parts 13A, 13B

Next, the first and second resistance parts 13A, 13B will be described. The first resistance part 13A has a plurality of first resistance elements 72A corresponding to the respective plurality of first transistor chips 12A, and a first resin part 74A as an insulating linking part linking the resistance elements 72A together, as illustrated in FIG. 1. Similarly, the second resistance part 13B has a plurality of second resistance elements 72B corresponding to the respective plurality of second transistor chips 12B, and a second resin part 74B as an insulating linking part linking the resistance elements 72B together, as illustrated in FIG. 1.

The configurations of the first and second resistance parts 13A, 13B will be described in details with reference to FIG. 7 to FIG. 9. Since the configurations of the first and second resistance parts 13A, 13B are substantially the same as each other, the first and second resistance parts 13A, 13B will be described by referring to each of the first and second resistance parts 13A, 13B as a resistance part 13. Similarly, each of the first and second resistance elements 72A, 72B, and each of the first and second resin parts 74A, 74B are referred to as a resistance element 72 and a resin part 74, respectively.

Figure 7:
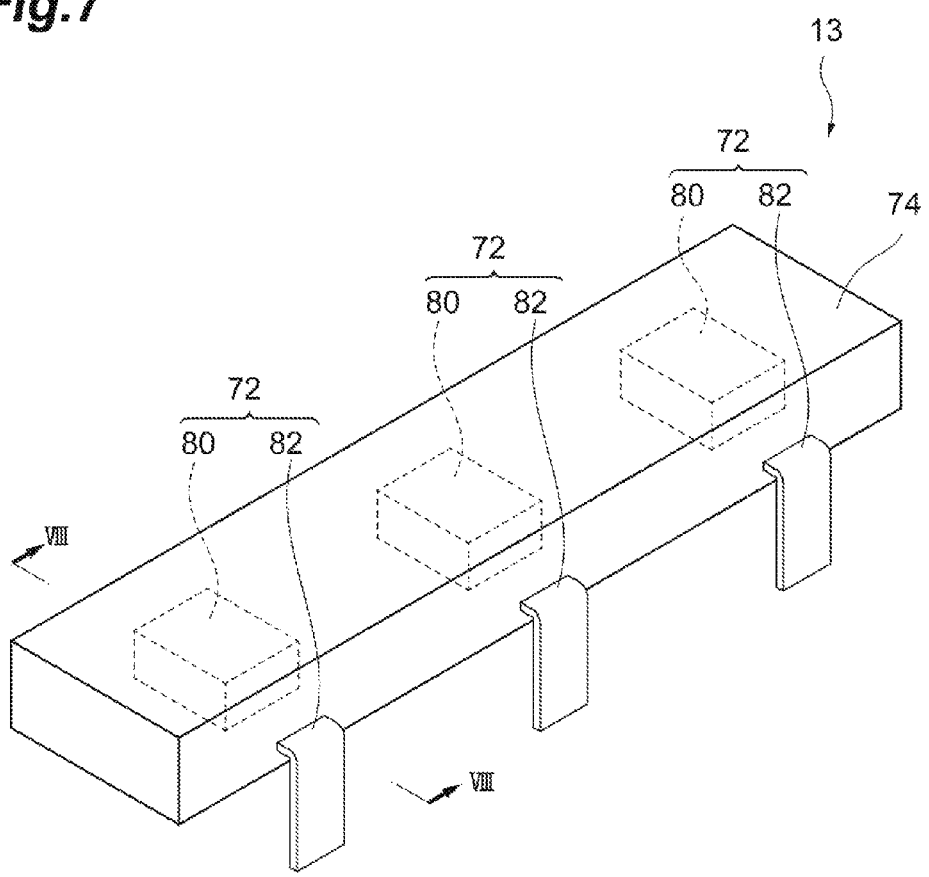
FIG. 7 is a schematic perspective view for describing first and second resistance parts included in the semiconductor module illustrated in FIG. 1.

The resistance part 13 has a plurality of resistance elements 72, and the plurality of resistance elements 72 are linked together by the resin part 74 as a linking part and integrated together, as illustrated in FIG. 7. Since the resistance elements 72 are arranged in parallel discretely in one direction, the resistance part 13 extends in the one direction.

The resistance elements 72 function as gate resistances for preventing fluctuation of the gate voltage in high speed operation of the semiconductor module 10A, in the semiconductor module 10A. Resistance values of the resistance elements 72 may be the same as each other; however, resistance values may be increased of the resistance elements 72 arranged at the input side of the gate voltage in the semiconductor module 10A.

Figure 8:
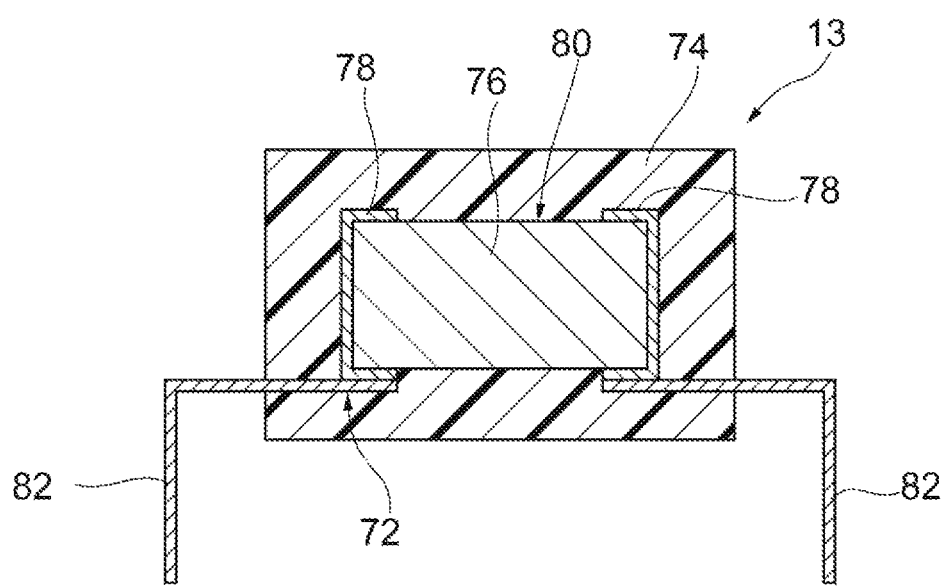
FIG. 8 is a schematic view of a cross section along a line VIII-VIII of FIG. 7.

Each of the resistance elements 72 has a body part 80 configured so that both ends of a resistor 76 are covered by respective conductive films 78, and each of the conductive films 78 is connected to a lead (terminal) 82 that is a plate-shaped conductive member, as illustrated in FIG. 8. The body part 80 and the lead 82 are connected together by using a conductive adhesive such as solder, for example.

The body part 80 is buried in the resin part 74, and a free end (an end opposite to a connecting portion of the body part 80) of each lead 82 protrudes from the resin part 74 to the outside. A portion protruding from the resin part 74 of each lead 82 is bent.

In FIG. 8, for convenience of description, the lengths of two leads 82 are the same as each other; however, the lengths of the leads 82 are adjusted according to a connection form to a target to be connected to the resistance part 13.

Figure 9:
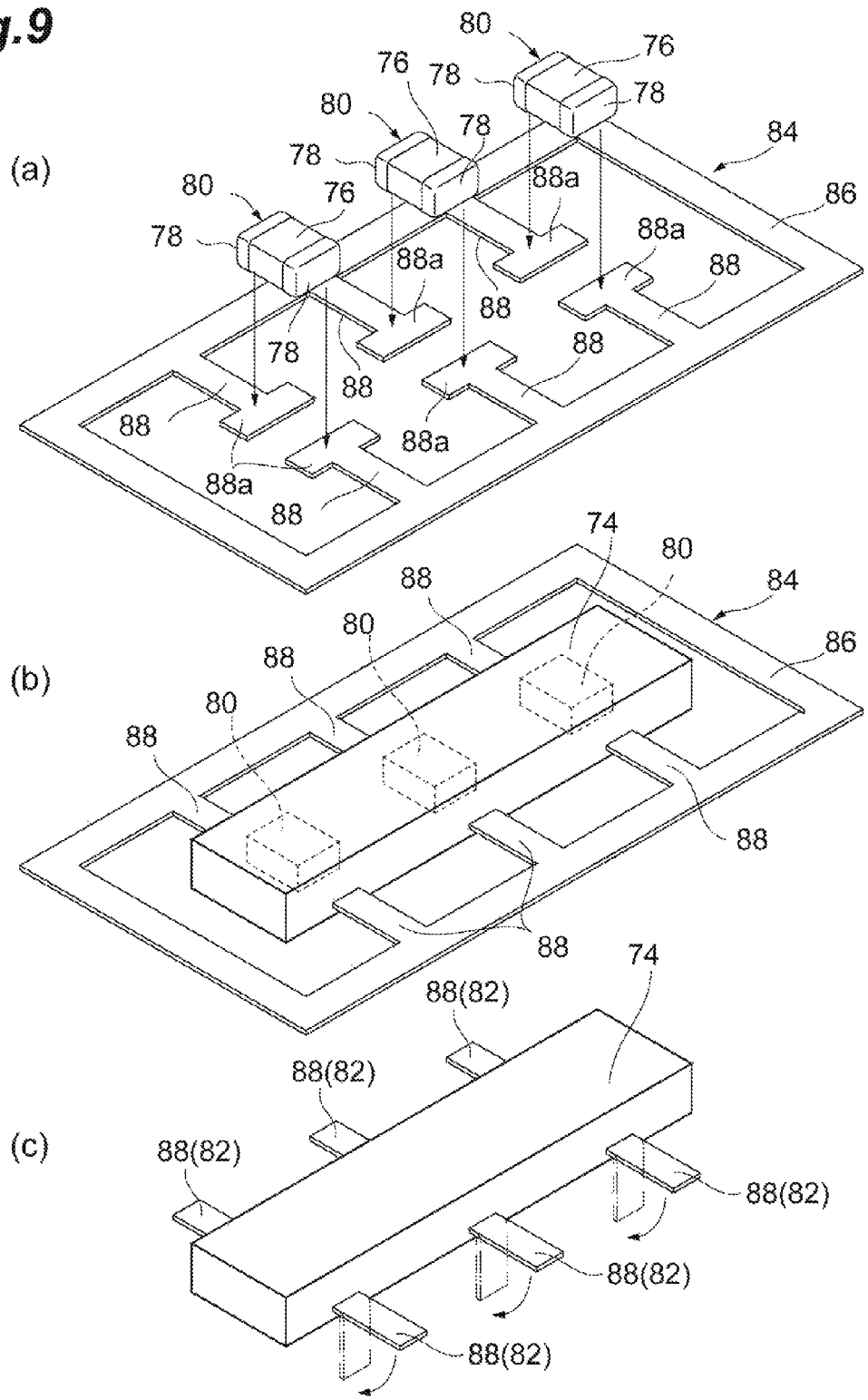
FIG. 9(a) is a schematic view illustrating a process of a method for manufacturing the resistance part illustrated in FIG. 7.
FIG. 9(b) is a schematic view illustrating a process subsequent to FIG. 9(a)
FIG. 9(c) is a schematic view illustrating a process subsequent to FIG. 9(b).

The resistance part 13 is manufactured as follows, for example A lead frame 84 having conductivity, and the plurality of body parts 80 (three in FIG. 9(*a*)) are prepared, as illustrated in FIG. 9(*a*).

The lead frame 84 has a plate-shaped frame 86 and a plurality of pair of leads 88 each of which extends to the inside from the edges facing each other of the frame 86 (three pair of leads 88 are illustrated in FIG. 9(*a*)). Each of the pair of leads 88 is a plate-shaped conductive member. The length in an extending direction of each of the leads 88 is shorter than the length (width) of the frame 86 in the extending direction, and free ends 88*a* of the pair of leads 88 are apart from each other.

The body part 80 is mounted on the pair of leads 88, 88 by using a conductive adhesive member such as solder so that the free ends 88*a* of the pair of leads 88, 88 are linked together by the body part 80.

Subsequently, the plurality of body parts 80 is molded with resin to form the resin part 74 linking the body parts 80 together, as illustrated in FIG. 9(*b*). After that, the pair of leads 88, 88 is detached from the frame 86, and the leads 88 protruding from the resin part 74 are bent, as illustrated in FIG. 9(*c*).

The pair of leads 88, 88 detached from the frame 86 and connected to the body part 80 is the leads 82 of the resistance element 72. For that reason, when the leads 88 are detached from the frame 86, the length of each of the leads 88 protruding from the resin part 74 is adjusted to the length according to the connection form to the target to be connected to the resistance part 13.

With the process described above, the resistance part 13 can be manufactured in which the resistance elements 72 each of which includes the body part 80 and the leads 82 linked to the body part 80, are linked together by the resin part 74. Incidentally, here, the resin part 74 is exemplified as the linking part linking the resistance elements 72 together; however, it is sufficient that the linking part can connect the plurality of resistance elements 72 together while insulating the resistance elements 72 from each other.

<1.2> Wiring Substrate 14

The wiring substrate 14 will be described with reference to FIG. 1 and FIG. 2. The wiring substrate 14 has an insulating substrate 90, and, on the front surface (principal surface) 90*a* of the insulating substrate 90, a first drain wiring pattern 92, a first gate wiring pattern 94, a second drain wiring pattern 96, a second gate wiring pattern 98, a first source wiring pattern 100, a second source wiring pattern 102, and a third source wiring pattern 104 are formed.

The first drain wiring pattern 92, the first gate wiring pattern (first control electrode wiring pattern) 94, the second drain wiring pattern 96, the second gate wiring pattern (second control electrode wiring pattern) 98, the first source wiring pattern 100, the second source wiring pattern 102, and the third source wiring pattern 104 configure a circuit pattern. An example of a material of these wiring patterns is copper.

An example of a shape in a plan view (a shape viewed from the thickness direction) of the insulating substrate 90 is a quadrilateral shape such as a rectangle or a square, as illustrated in FIG. 1. An example of a material of the insulating substrate 90 includes AlN, SiN, and $Al_2O_3$.

The first drain wiring pattern 92 has the first chip mounting region (first chip wiring pattern) 92A and a first external connection region 92B. The first chip mounting region 92A is a region on which the plurality of first transistor chips 12A is mounted.

The first external connection region 92B is a region to which an output terminal is connected for externally outputting an output voltage from the semiconductor module 10A. The first external connection region 92B is physically integrated with the first chip mounting region 92A. In one embodiment, the first external connection region 92B contiguously protrudes from the first chip mounting region 92A. The first external connection region 92B may be arranged in the vicinity of an edge 90*b* of the insulating substrate 90.

The first gate wiring pattern 94 is a region to which a gate terminal is connected for inputting a gate voltage (control voltage) as a gate signal supplied to each of the first transistor chips 12A. The first gate wiring pattern 94 extends in a predetermined direction A in the front surface 90*a* of the insulating substrate 90. The predetermined direction A is a direction orthogonal to the edge 90*b* or the edge 90*c* (a short direction in FIG. 1), as illustrated in FIG. 1, and this also applies to other drawings.

The second drain wiring pattern 96 has a second chip mounting region (second chip wiring pattern) 96A and a second external connection region 96B. The second chip mounting region 96A is a region on which the plurality of second transistor chips 12B is mounted.

The second external connection region 96B is physically integrated with the second chip mounting region 96A. In one embodiment, the second external connection region 96B contiguously protrudes from the second chip mounting region 96A. The second external connection region 96B is a region to which a terminal is connected for supplying a positive voltage to each of the second transistor chips 12B. The second external connection region 96B may be arranged in the vicinity of the edge 90*b* together with the first external connection region 92B.

The second gate wiring pattern 98 is a region to which a gate terminal is connected for inputting a gate voltage as a gate signal supplied to each of the second transistor chips 12B. The second gate wiring pattern 98 extends in the predetermined direction A similarly to the first gate wiring pattern 94.

The first source wiring pattern 100 is a region to which a source terminal is connected for externally outputting a source potential that is a reference of the gate voltage as the gate signal for controlling each of the first transistor chips 12A. In one embodiment, the first source wiring pattern 100 may be arranged in the vicinity of the first drain wiring pattern 92 and the first gate wiring pattern 94 in the edge 90*c* side of the insulating substrate 90.

The second source wiring pattern 102 is a region to which a source terminal is connected for externally outputting a source potential that is a reference of the gate voltage for controlling each of the second transistor chips 12B. In one embodiment, the second source wiring pattern 102 may be arranged in the vicinity of the second drain wiring pattern 96 and the second gate wiring pattern 98 in the edge 90*c* side.

The third source wiring pattern 104 is a region to which a terminal is connected for supplying a negative voltage to each of the first transistor chips 12A. The third source wiring pattern 104 may be arranged in the vicinity of the edge 90*b* together with the first external connection region 92B and the second external connection region 96B.

<1.3> Specific Configuration of Semiconductor Module 10A

Next, the specific configuration of the semiconductor module 10A will be described with reference to FIG. 1 and FIG. 2.

The plurality of first transistor chips 12A is discretely arranged in the predetermined direction (first predetermined direction) A on the first drain wiring pattern 92, as illustrated in FIG. 1. The plurality of first transistor chips 12A is arranged on the first chip mounting region 92A of the first drain wiring pattern 92 so that the drain electrode pad (second main electrode pad) 20 is positioned at the first gate wiring pattern 94 side.

Each of the plurality of first transistor chips 12A is mounted on the first chip mounting region 92A of the first drain wiring pattern 92 so that the back surface 12*b* of each of the first transistor chips 12A faces the front surface 90*a* of the insulating substrate 90, so that the drain electrode pad 20 is connected to the first drain wiring pattern 92, as illustrated in FIG. 2.

Specifically, the drain electrode pad 20 is joined to the first chip mounting region 92A via a conductive adhesive such as solder, and each of the first transistor chips 12A is mounted on the first chip mounting region 92A. Thus, the drain electrode pad 20 and the first drain wiring pattern 92 are electrically connected together.

Since the drain electrode pad 20 faces the first drain wiring pattern 92, the gate electrode pad (control electrode pad) 16 and the source electrode pad (first main electrode pad) 18 of each of the first transistor chips 12A are positioned at the opposite side to the wiring substrate 14.

The plurality of second transistor chips 12B is discretely arranged in the predetermined direction (second predetermined direction) A on the second drain wiring pattern 96. The plurality of second transistor chips 12B is arranged on the second chip mounting region 96A of the second drain wiring pattern 96 so that the gate electrode pad (control electrode pad) 16 is positioned at the second gate wiring pattern 98 side.

Each of the plurality of second transistor chips 12B is mounted on the second drain wiring pattern 96 so that the back surface 12*b* of each of the second transistor chips 12B faces the front surface 90*a* of the insulating substrate 90, so that the drain electrode pad 20 is connected to the second drain wiring pattern 96.

Specifically, the drain electrode pad 20 is joined to the second chip mounting region 96A of the second drain wiring pattern 96 via a conductive adhesive such as solder, so that each of the second transistor chips 12B is mounted on the second chip mounting region 96A. Thus, the drain electrode pad 20 and the second drain wiring pattern 96 are electrically connected together.

Since the drain electrode pad 20 faces the first drain wiring pattern 92, the gate electrode pad (control electrode pad) 16 and the source electrode pad (first main electrode pad) 18 of each of the second transistor chips 12B are positioned at the opposite side to the wiring substrate 14.

The source electrode pads 18 of adjacent first transistor chips 12A are connected together via a first wire (conducting wire) W1, as illustrated in FIG. 1. Similarly, the source electrode pads 18 of adjacent second transistor chips 12B are connected together via the first wire (conducting wire) W1.

In one embodiment, as for wiring by the first wire W1, for example, a thicker first wire W1 may be used, or a plurality of the first wires W1 may be used, to allow a large current to flow. When the plurality of first wires W1 is used, the thicker first wire W1 may be used for at least one of the first wires W1, for example.

Further, the source electrode pads 18 of the plurality of first transistor chips 12A are connected to the first source wiring pattern 100 via a second wire (conducting wire) W2. In addition, the source electrode pads 18 of the plurality of first transistor chips 12A are connected to the third source wiring pattern 104 via a third wire (conducting wire) W3.

For example, of the first transistor chips 12A arranged along the predetermined direction A, the source electrode pad 18 of one of the first transistor chips 12A closest to the first source wiring pattern 100 and the first source wiring pattern 100 are connected together via the second wire W2, and the source electrode pad 18 of one of the first transistor chips 12A closest to the third source wiring pattern 104 and the third source wiring pattern 104 are connected together via the third wire W3.

In one embodiment, as for connection between the source electrode pad 18 of each of the first transistor chips 12A and the first source wiring pattern 100, for example, a thicker second wire W2 may be used, or a plurality of the second wire W2 may be used, to allow a large current to flow. When the plurality of second wires W2 is used, the thicker second wire W2 may be used for at least one of the second wires W2, for example.

This also applies to connection between the source electrode pad 18 of each of the first transistor chips 12A and the third source wiring pattern 104. That is, a thicker third wire W3 may be used, or a plurality of the third wires W3 may be used. When the plurality of third wires W3 is used, the thicker third wire W3 may be used for at least one of the third wires W3, for example.

The source electrode pad 18 of each of the second transistor chips 12B is connected to the second source wiring pattern 102 via a fourth wire (conducting wire) W4. For example, of the second transistor chips 12B arranged along the predetermined direction A, the source electrode pad 18 of one of the second transistor chips 12B closest to the second source wiring pattern 102 and the second source wiring pattern 102 are connected together via the fourth wire W4.

Further, each of the source electrode pads 18 of the plurality of second transistor chips 12B is connected to the first chip mounting region 92A via the fifth wire (conducting wire) W5.

In one embodiment, as for connection between the source electrode pad 18 of each of the second transistor chips 12B and the second source wiring pattern 102, for example, a thicker fourth wire W4 may be used, or a plurality of the fourth wires W4 may be used, to allow a large current to flow. When the plurality of fourth wires W4 is used, the thicker fourth wire W4 may be used for at least one of the fourth wires W4, for example.

This also applies to connection between the source electrode pad 18 of each of the second transistor chips 12B and the first chip mounting region 92A. That is, a thicker fifth wire W5 may be used, or a plurality of the fifth wires W5 may be used. When the plurality of fifth wires W5 is used, the thicker fifth wire W5 may be used for at least one of the fifth wires W5, for example.

The connections by the first to fifth wires W1 to W5 can be made by, for example, wire bonding. In addition, the connections by the first to fifth wires Who W5 may be collectively made after the plurality of first and second transistor chips 12A, 12B are joined to the wiring substrate 14.

The gate electrode pads 16 of the plurality of first transistor chips 12A are connected to the first gate wiring pattern 94 via the first resistance part 13A. Specifically, one lead 82 of each of the first resistance elements 72A included in the first resistance part 13A and the resistance connection region 16A of the gate electrode pad 16 of the corresponding first transistor chip 12A are physically connected together via a conductive adhesive such as solder, as illustrated in FIG. 2. In addition, the other lead 82 of each of the first resistance elements 72A is physically connected to the first gate wiring pattern 94 via a conductive adhesive such as solder.

Since the gate electrode pad 16 of each of the first transistor chips 12A is positioned at the opposite side to the wiring substrate 14, the position of the gate electrode pad 16 is substantially higher than the position of the front surface 90a of the insulating substrate 90 by the thickness of each of the first transistor chips 12A.

For that reason, of the pair of leads 82 of each of the first resistance elements 72A, the lead 82 connected to the gate electrode pad 16 is shorter than the lead 82 connected to the first gate wiring pattern 94.

Similarly, the gate electrode pads 16 of the plurality of second transistor chips 12B are connected to the second gate wiring pattern 98 via the second resistance part 13B. Specifically, one lead 82 of each of the second resistance elements 72B included in the second resistance part 13B and the resistance connection region 16A of the gate electrode pad 16 of the corresponding second transistor chip 12B are physically connected together via a conductive adhesive such as solder, as illustrated in FIG. 2. In addition, the other lead 82 of each of the second resistance elements 72B is physically connected to the second gate wiring pattern 98 via a conductive adhesive such as solder.

Similarly to the case of each of the first resistance elements 72A, of the pair of leads 82 of each of the second resistance elements 72B, the lead 82 connected to the gate electrode pad 16 is shorter than the lead 82 connected to the second gate wiring pattern 98.

The semiconductor module 10A is manufactured as follows, for example. Solder plating is performed to each of the electrode pads of the first transistor chips 12A and the second transistor chips 12B. In addition, solder plating is performed to the leads 82 included in the first and second resistance parts 13A, 13B.

After that, the plurality of first and second transistor chips 12A, 12B and the first and second resistance parts 13A, 13B are arranged as illustrated in FIG. 1. The transistor chips and the resistance parts are collectively joined to the wiring substrate 14 by reflow. Subsequently, wiring using the first to fifth wires W1 to W5 is performed as appropriate. The wiring can be made by, for example, wire bonding.

<1.4> Functional Effects of Semiconductor Module 10A

In the semiconductor module 10A, the drain electrode pad (second main electrode pad) 20 of each of the first transistor chips 12A is connected to the first chip mounting region 92A, and the source electrode pads 18 are connected together via the first wire W1. Therefore, the plurality of first transistor chips 12A is connected together in parallel. The gate electrode pad 16 of each of the first transistor chips 12A is connected to the first gate wiring pattern 94 via each of the first resistance elements 72A included in the first resistance part 13A.

Similarly, the drain electrode pad 20 of each of the second transistor chips 12B is connected to the second chip mounting region 96A, and the source electrode pads 18 are connected together via the first wire W1. Therefore, the plurality of second transistor chips 12B is connected together in parallel. The gate electrode pad 16 of each of the second transistor chips 12B is connected to the second gate wiring pattern 98 via each of the second resistance elements 72B included in the second resistance part 13B.

Further, the source electrode pad 18 of each of the second transistor chips 12B is connected to the first chip mounting region 92A via the fifth wire W5. For that reason, the drain electrode pads 20 of the plurality of first transistor chips 12A connected together in parallel and the source electrode pads 18 of the plurality of second transistor chips 12B connected together in parallel are electrically connected together in series.

Figure 10:
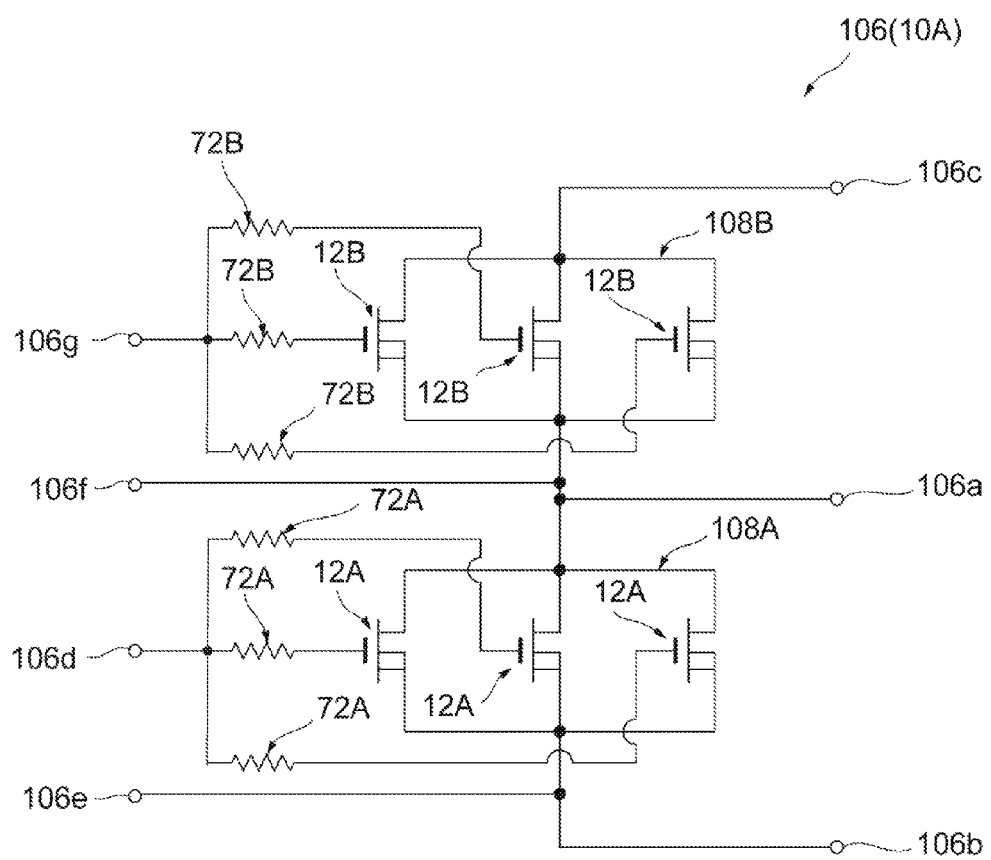
FIG. 10 is a schematic view illustrating an equivalent circuit of the semiconductor module illustrated in FIG. 1.

Therefore, an inverter circuit 106 is achieved as an equivalent circuit to the semiconductor module 10A, by the configuration of the semiconductor module 10A, as illustrated in FIG. 10. For that reason, the semiconductor module 10A can be operated as a power converter that is an inverter.

In the semiconductor module 10A, the plurality of first transistor chips 12A connected together in parallel configures a first semiconductor switch part 108A of the lower arm in the inverter circuit 106, and the plurality of second transistor chips 12B connected together in parallel configures a second semiconductor switch part 108B of the upper arm in the inverter circuit 106. The first and second semiconductor switch parts 108A, 108B are connected together in series.

In FIG. 10, the first external connection region 92B, the third source wiring pattern 104, and the second external connection region 96B are schematically illustrated as an output terminal (O terminal) 106a, a negative voltage input terminal (N terminal) 106b, and a positive voltage input terminal (P terminal) 106c, respectively. In addition, the first gate wiring pattern 94, the first source wiring pattern 100, the second source wiring pattern 102, and the second gate wiring pattern 98 are schematically illustrated as a first gate terminal 106d, a first source terminal 106e, a second source terminal 106f, and a second gate terminal 106g, respectively.

The semiconductor module 10A has the first resistance part 13A and the second resistance part 13B in the module.

Each of the first resistance elements 72A of the first resistance part 13A functions as the gate resistance to the corresponding first transistor chip 12A. For that reason, in the semiconductor module 10A, fluctuation of the gate voltage (control voltage) to each of the first transistor chips 12A can be suppressed by each of the first resistance elements 72A.

Similarly, each of the second resistance elements 72B of the second resistance part 13B functions as the gate resistance to the corresponding second transistor chip 12B. For that reason, in the semiconductor module 10A, fluctuation of the gate voltage (control voltage) to each of the second transistor chips 12B can be suppressed by each of the second resistance elements 72B.

In the semiconductor module 10A, the first resistance part 13A is directly connected to each of the first transistor chips 12A and the first gate wiring pattern 94. Thus, wire is not necessary for wiring between each of the first transistor chips 12A and the first resistance part 13A (first resistance element 72A).

Therefore, the number of wires is reduced in the first transistor chip 12A side (lower arm side), in the semiconductor module 10A including the first resistance part 13A. For that reason, influence of an inductance component of the wire can be reduced. Thus, fluctuation of the gate potential at a high frequency of the first transistor chip 12A side is suppressed. As a result, high speed operation of the semiconductor module 10A is possible further. Further, since a wiring pattern is not necessary required for wiring with a wire between the first resistance part 13A and the first transistor chip 12A, the semiconductor module 10A can be downsized.

As described above, since the number of wires for wiring can be reduced in the semiconductor module 10A, the number of times of wire connection (for example, the number of times of wire bonding) can be reduced. As a result, the semiconductor module 10A can be efficiently manufactured.

In the first resistance part 13A, the plurality of first resistance elements 72A is linked together by the first resin part 74A, and integrated together. For that reason, the first resistance part 13A has three or more leads 82. Thus, when mounted to each of the first transistor chips 12A, the first resistance part 13A physically stands by itself more easily than each one of the first resistance elements 72A itself. Therefore, the first resistance part 13A is easily connected to the resistance connection region 16A, and misalignment hardly occurs when each of the first resistance elements 72 and the resistance connection region 16A are connected together. As a result, the semiconductor module 10A can be efficiently manufactured.

Functional effects associated with the configuration of the first resistance part 13A and the mounting form of the first resistance part 13A have been described, and the configuration of the second resistance part 13B and the mounting form of the second resistance part 13B are similar to those of the first resistance part 13A, that is, the first semiconductor switch part 108A side as the lower arm. Therefore, the semiconductor module 10A has similar functional effects also regarding the configuration of the second resistance part 13B and the mounting form of the second resistance part 13B. As a result, the semiconductor module 10A can be more efficiently manufactured.

Each one of the first transistor chips 12A and the second transistor chips 12B is a vertical transistor chip. For that reason, the first transistor chips 12A and the second transistor chips 12B are respectively mounted on the first chip mounting region 92A and the second chip mounting region 96A so that the respective drain electrode pads 20 face the first chip mounting region 92A and the second chip mounting region 96A. For that reason, the wire is not necessary for wiring the drain electrode pads 20 of the plurality of first transistor chips 12A. Similarly, the wire is not necessary for wiring the drain electrode pads 20 of the plurality of second transistor chips 12B. Since the number of wires for wiring can be reduced in the semiconductor module 10A also in this point, the number of times of wire connection (for example, the number of times of wire bonding) can be reduced. As a result, the semiconductor module 10A can be efficiently manufactured.

Further, the gate electrode pad 16 of each one of the first transistor chips 12A and the second transistor chips 12B has a resistance connection region 16A extending along the predetermined direction A. For that reason, the connection region can be secured more for connecting the lead 82. Therefore, misalignment can be further reduced between each of the first resistance elements 72A of the first resistance part 13A and the gate electrode pad 16, and between each of the second resistance elements 72B of the second resistance part 13B and the gate electrode pad 16. As a result, the semiconductor module 10A can be more efficiently manufactured.

In each one of the first transistor chips 12A and the second transistor chips 12B mounted on the wiring substrate 14, the resistance connection region 16A extends in the predetermined direction A. For that reason, misalignment can be further reduced of the first resistance part 13A and the second resistance part 13B when the first resistance part 13A and the second resistance part 13B are connected to the respective gate electrode pads 16. As a result, the semiconductor module 10A can be more efficiently manufactured.

In one embodiment, at least a part of the resistance connection region 16A is provided on the circumferential portion 24. For example, the resistance connection region 16A protrudes from the cell portion 22 toward the circumferential portion 24 to the outside, as illustrated in FIG. 3. The circumferential portion 24 is provided for securing the breakdown voltage characteristic, and is a region not substantially contributing to transistor operation. Because at least a part of the resistance connection region 16A is provided on the circumferential portion 24, a region of the cell portion 22 substantially functioning as a transistor function can be secured even when the resistance connection region 16A is formed.

In one embodiment, the gate electrode pad 16 has a probe connection region 16B. Usually, the inspection probe is in contact with the gate electrode pad of the transistor chip and stress is added, for inspecting whether or not the transistor chip normally operates.

In an embodiment in which the gate electrode pad 16 has the probe connection region 16B separately from the resistance connection region 16A, a region with which the inspection probe is in contact and a region to which the resistance is connected can be distinguished from each other. For that reason, no extra stress is added to the resistance connection region 16A during inspection, and the resistance connection region 16A can be used in an optimum state for resistance connection.

In an embodiment in which a MOSFET using a wide band gap semiconductor is used as each of the first and second transistor chips 12A, 12B, the semiconductor module 10A is excellent in the breakdown voltage characteristic, and is capable of high speed operation.

Currently, the size of a semiconductor device using the wide band gap semiconductor tends to be smaller than the conventional semiconductor device using Si. However, because the plurality of first transistor chips 12A is connected together in parallel to configure the first semiconductor switch part 108A, and the plurality of second transistor chips 12B is connected together in parallel to configure the second semiconductor switch part 108B, a large current can be allowed to flow.

<2> Second Embodiment

Figure 11:
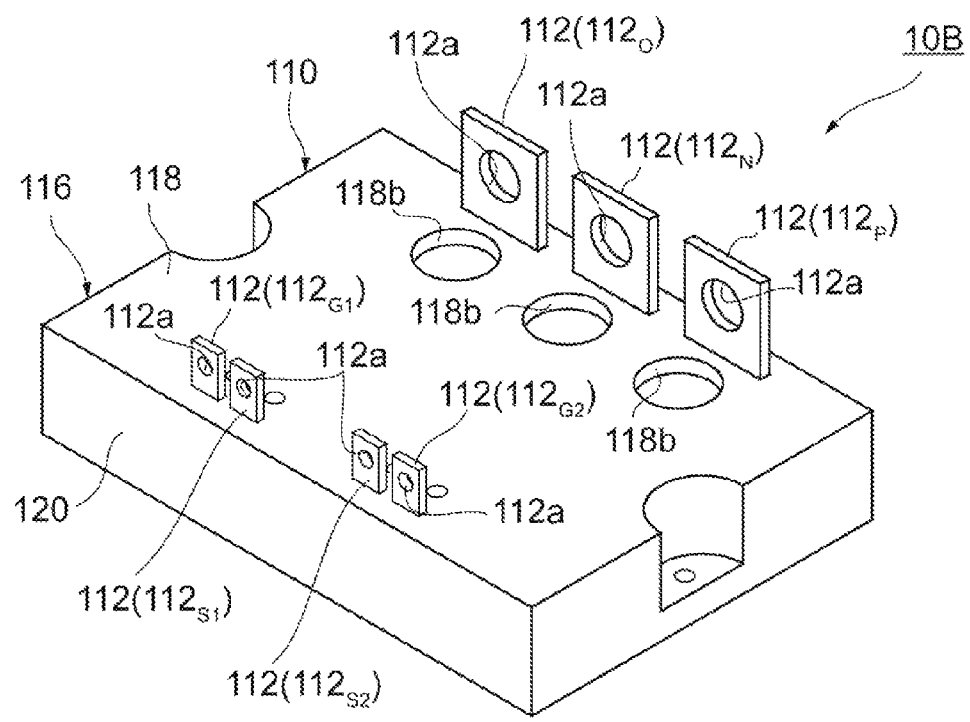
FIG. 11 is a schematic plan view of a semiconductor module according to a second embodiment.
Figure 12:
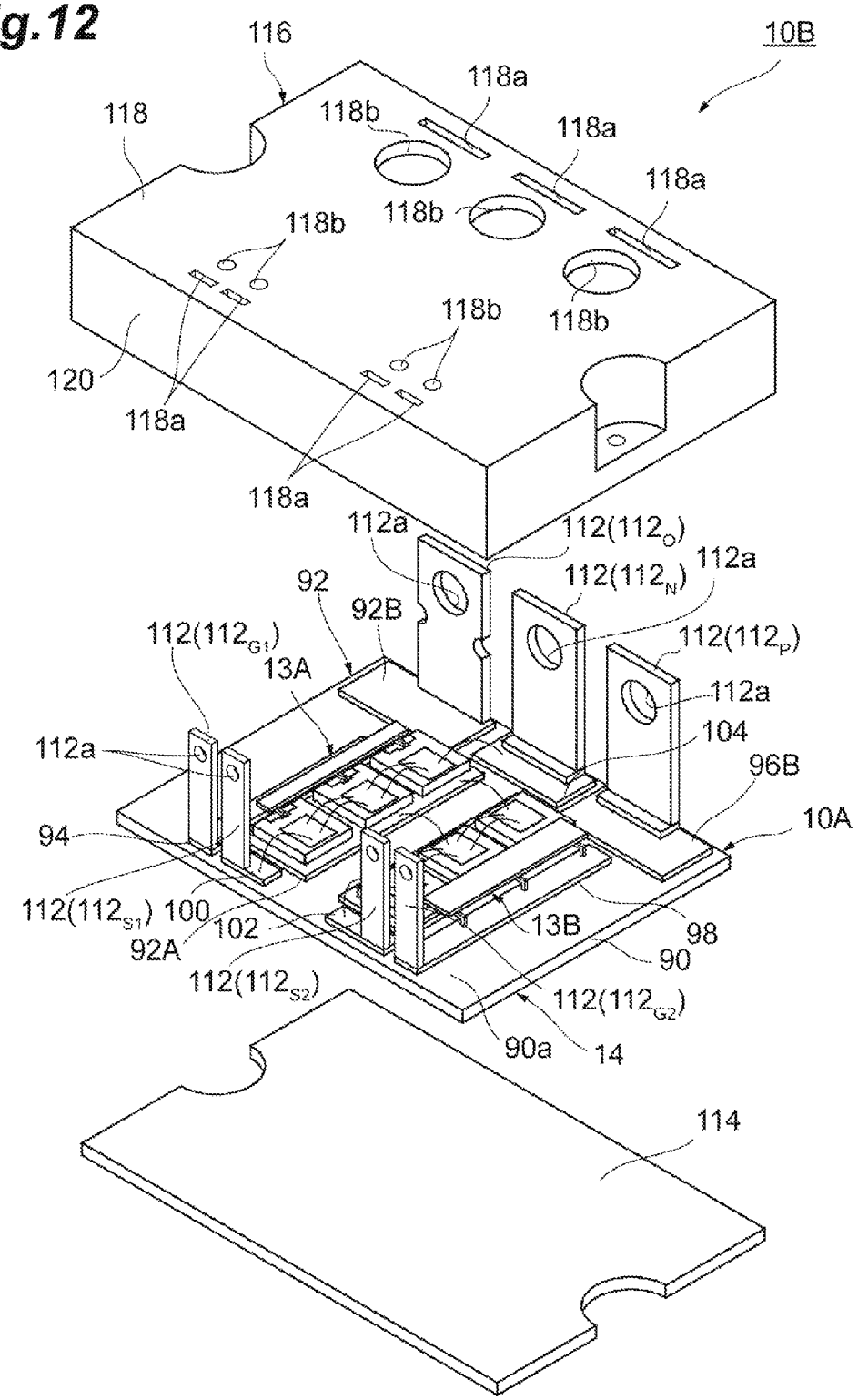
FIG. 12 is a schematic exploded perspective view of the semiconductor module illustrated in FIG. 11.

A semiconductor module 10B according to a second embodiment will be described. The semiconductor module 10B may include a semiconductor module 10A according to the first embodiment, a housing 110 for accommodating the semiconductor module 10A, and seven bus bars 112 for external connection, as illustrated in FIG. 11 and FIG. 12. When the seven bus bars 112 are distinguished from each other and described, the seven bus bars 112 are individually referred to as a bus bar $112_O$, $112_N$, $112_P$, $112_{G1}$, $112_{S1}$, $112_{S2}$, or $112_{G2}$.

The housing 110 has a bottom plate 114 on which a wiring substrate 14 mounted with a plurality of first and second transistor chips 12A, 12B and the like is placed, and a cover part 116 for covering the wiring substrate 14, as illustrated in FIG. 12. An example of a material of the bottom plate 114 is a metal such as copper. In this case, the bottom plate 114 also functions as a heat sink.

The cover part 116 has a top plate 118, and a side wall 120 standing from the outer edge of the top plate 118 to the bottom plate 114 side, and has a bottomed cylindrical shape. The top plate 118 has insertion holes 118a through which the respective bus bars 112 are inserted.

The bus bar $112_O$ is electrically connected to the first external connection region 92B of the first drain wiring pattern 92. For example, one end of the bus bar $112_O$ can be connected to the first external connection region 92B via a conductive adhesive such as solder, as illustrated in FIG. 12. Thus, the bus bar $112_O$ functions as the output terminal.

The bus bar $112_N$ is electrically connected to a third source wiring pattern 104. For example, one end of the bus bar $112_N$ can be connected to the third source wiring pattern 104 via a conductive adhesive such as solder, as illustrated in FIG. 12. Thus, the bus bar $112_N$ functions as a negative voltage input terminal.

The bus bar $112_P$ is electrically connected to a second external connection region 96B. For example, one end of the bus bar $112_P$ can be connected to the second external connection region 96B via a conductive adhesive such as solder, as illustrated in FIG. 12. Thus, the bus bar $112_P$ functions as a positive voltage input terminal.

The bus bar $112_{G1}$ is electrically connected to a first gate wiring pattern 94. For example, one end of the bus bar $112_{G1}$ can be connected to the first gate wiring pattern 94 via a conductive adhesive such as solder, as illustrated in FIG. 12. Thus, the bus bar $112_{G1}$ functions as an input terminal (first gate terminal) of a gate voltage to each of the first transistor chips 12A.

The bus bar $112_{S1}$ is electrically connected to a first source wiring pattern 100. For example, one end of the bus bar $112_{S1}$ can be connected to the first source wiring pattern 100 via a conductive adhesive such as solder, as illustrated in FIG. 12. Thus, the bus bar $112_{S1}$ functions as a source terminal (first source terminal) to each of the first transistor chips 12A.

The bus bar $112_{S2}$ is electrically connected to a second source wiring pattern 102. For example, one end of the bus bar $112_{S2}$ can be connected to the second source wiring pattern 102 via a conductive adhesive such as solder, as illustrated in FIG. 12. Thus, the bus bar $112_{S2}$ functions as a source terminal (second source terminal) to each of the second transistor chips 12B.

The bus bar $112_{G2}$ is electrically connected to a second gate wiring pattern 98. For example, one end of the bus bar $112_{G2}$ can be connected to the second gate wiring pattern 98 via a conductive adhesive such as solder, as illustrated in FIG. 12. Thus, the bus bar $112_{G2}$ functions as an input terminal (second gate terminal) to a gate voltage to each of the second transistor chips 12B.

In a region drawn outside the housing 110 in each of the bus bars 112, an insertion hole 112a is formed through which a fastener such as a bolt is inserted so that a connection terminal to an external device can be fastened thereto.

In FIG. 11, the bus bars 112 extend in the normal direction of the front surface of the top plate 118; however, the bus bars 112 may be bent toward the top plate 118 side when the bus bars 112 are connected to the external device. When the bus bars 112 are connected to the external device, the connection terminal and the like from the external device are fixed by bolts and nuts by using the insertion holes 118a. For that reason, accommodation holes 118b in which bolt heads or nuts are accommodated when the bus bars 112 are bent may be formed in the top plate 118.

The semiconductor module 10B accommodates the semiconductor module 10A in the housing 110. For that reason, the semiconductor module 10B has functional effects similar to those of semiconductor module 10A.

<3> Third Embodiment

Figure 13:
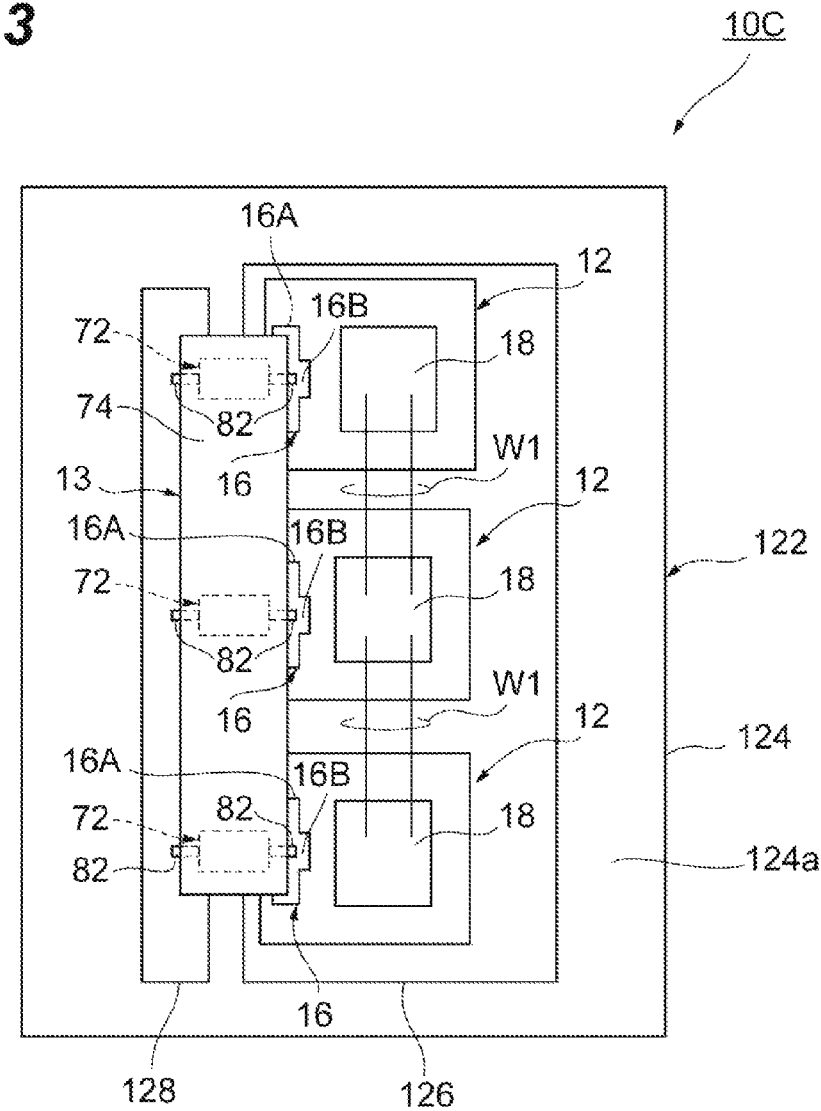
FIG. 13 is a schematic plan view of a semiconductor module according to a third embodiment.

A semiconductor module according to a third embodiment will be described with reference to FIG. 13. A semiconductor module 10C illustrated in FIG. 13 includes a plurality of transistor chips 12, a resistance part 13, and a wiring substrate 122. The semiconductor module 10C is a semiconductor module functioning as a semiconductor switch.

The configuration of each of the transistor chips 12 is similar to the transistor chip illustrated in FIG. 3. In addition, the configuration of the resistance part 13 is similar to that of the resistance part illustrated in FIG. 7. For that reason, descriptions of the transistor chip and the resistance part will be omitted.

The wiring substrate 122 has an insulating substrate 124, and, on a principal surface 124a of the insulating substrate 124, a chip mounting region (chip wiring pattern) 126 and a gate wiring pattern (control electrode wiring pattern) 128 are formed. The chip mounting region 126 and the gate wiring pattern 128 are made of copper, for example.

The chip mounting region 126 and the gate wiring pattern 128 are regions respectively similar to the first chip mounting region 92A and the first gate wiring pattern 94 included in the first drain wiring pattern 92 in the semiconductor module 10A. The mounting forms of the transistor chips 12 and the resistance part 13 to the chip mounting region 126 and the gate wiring pattern 128 are similar to the mounting forms of the first transistor chips 12A and the first resistance part 13A in the semiconductor module 10A.

Therefore, in the semiconductor module 10C, drain electrode pads 20 of the plurality of transistor chips 12 are connected together via the chip mounting region 126, and source electrode pads 18 are connected together via the first wire W1. For that reason, the plurality of transistor chips 12 is electrically connected together in parallel, and functions as one semiconductor switch.

Further, in the semiconductor module 10C, a gate electrode pad 16 of each of the transistor chips 12 is connected to the gate wiring pattern 128 via the resistance part 13. Specifically, the gate electrode pad 16 of the transistor chips 12 is connected to the gate wiring pattern 128 via each of resistance elements 72 included in the resistance part 13.

Therefore, the semiconductor module 10C has functional effects similar to those of the semiconductor module 10A. For example, each of the resistance elements 72 of the resistance part 13 functions as a gate resistance to the corresponding transistor chip 12. For that reason, in the semiconductor module 10C, fluctuation of the gate voltage (control voltage) to each of the transistor chips 12 can be suppressed by each of the resistance elements 72.

In the semiconductor module 10C, the resistance part 13 is directly connected to each of the transistor chips 12 and the gate wiring pattern 128. Thus, wire is not necessary for wiring between each of the transistor chips 12 and the resistance part 13 (resistance elements 72). For that reason, high speed operation of the semiconductor module 10C is possible, similarly to the case of the semiconductor module 10A. Further, the semiconductor module 10C can be downsized.

As described above, since the number of wires for wiring can be reduced in the semiconductor module 10C, the number of times of wire connection (for example, the number of times of wire bonding) can be reduced. As a result, the semiconductor module 10C can be efficiently manufactured.

In the resistance part 13, the plurality of resistance elements 72 is linked together by the resin part 74, and integrated together. For that reason, the resistance part 13 has three or more leads 82. Thus, when mounted to each of the transistor chips 12, the resistance part 13 physically stands by itself more easily than each one of the resistance elements 72 itself. For that reason, the resistance part 13 is easily connected to a resistance connection region 16A, and misalignment hardly occurs when each of the resistance elements 72 and the resistance connection region 16A are connected together. As a result, the semiconductor module 10C can be efficiently manufactured.

Further, the gate electrode pad 16 of each of the transistor chips 12 has a resistance connection region 16A extending along a predetermined direction A. For that reason, the connection region can be secured more for connecting the lead 82. Therefore, misalignment can be further reduced between each of the resistance elements 72 of the resistance part 13 and the gate electrode pad 16. As a result, the semiconductor module 10C can be more efficiently manufactured.

In each of the transistor chips 12 mounted on the wiring substrate 122, the resistance connection region 16A extends in the predetermined direction A. For that reason, misalignment can be further reduced of the resistance part 13 when the gate electrode pad 16 is connected to the resistance part 13. As a result, the semiconductor module 10C can be more efficiently manufactured.

The functional effects for the embodiment in which a part of the resistance connection region 16A is provided at least on a circumferential portion 24 and the embodiment in which the gate electrode pad 16 has a probe connection region 16B are similar to those of the semiconductor module 10A.

Each of the transistor chips 12 is a vertical transistor chip. Each of the transistor chips 12 is mounted on the chip mounting region 126 so that the drain electrode pad 20 faces the chip mounting region 126. Therefore, the wire is not necessary for wiring the drain electrode pads 20 of the plurality of transistor chips 12. Since the number of wires for wiring can be reduced in the semiconductor module 10A also in this point, the number of times of wire connection (for example, the number of times of wire bonding) can be reduced. As a result, the semiconductor module 10C can be efficiently manufactured.

In an embodiment in which a MOSFET using a wide band gap semiconductor is used as each of the transistor chips 12, the semiconductor module 10C is excellent in the breakdown voltage characteristic, and is capable of high speed operation.

Currently, the size of a semiconductor device using the wide band gap semiconductor tends to be smaller than the conventional semiconductor device using Si. However, the plurality of transistor chips 12 is connected together in parallel, so that a large current can be allowed to flow.

Here, the chip mounting region 126 and the gate wiring pattern 128 have been described with reference to a correspondence between the first drain wiring pattern 92 and the first gate wiring pattern 94 in the semiconductor module 10A, as an example. However, the chip mounting region 126 and the gate wiring pattern 128 are also regions respectively similar to the second chip mounting region 96A and the second gate wiring pattern 98 included in the second drain wiring pattern 96 in the semiconductor module 10A.

Therefore, the semiconductor module 10A described as the first embodiment can be regarded as a semiconductor module combining two semiconductor modules 10C described in the third embodiment.

Various embodiments according to the present invention have been described above; however, the present invention is not limited to various forms described above, and can be variously modified without departing from the spirit of the invention.

Usually, each of the first and second transistor chips 12A, 12B as a MOSFET, because of its configuration, have a parasitic diode inside the chip, and the parasitic diode can function as a freewheeling diode. For that reason, as the semiconductor module according to the first embodiment, an embodiment has been exemplified in which the freewheeling diode is not mounted separately from each of the first and second transistor chips.

However, for example, the semiconductor module may have the freewheeling diode chip separately from each of the first and second transistor chips. An example will be described of a configuration of a semiconductor module having the freewheeling diode, with reference to FIG. 14.

Figure 14:
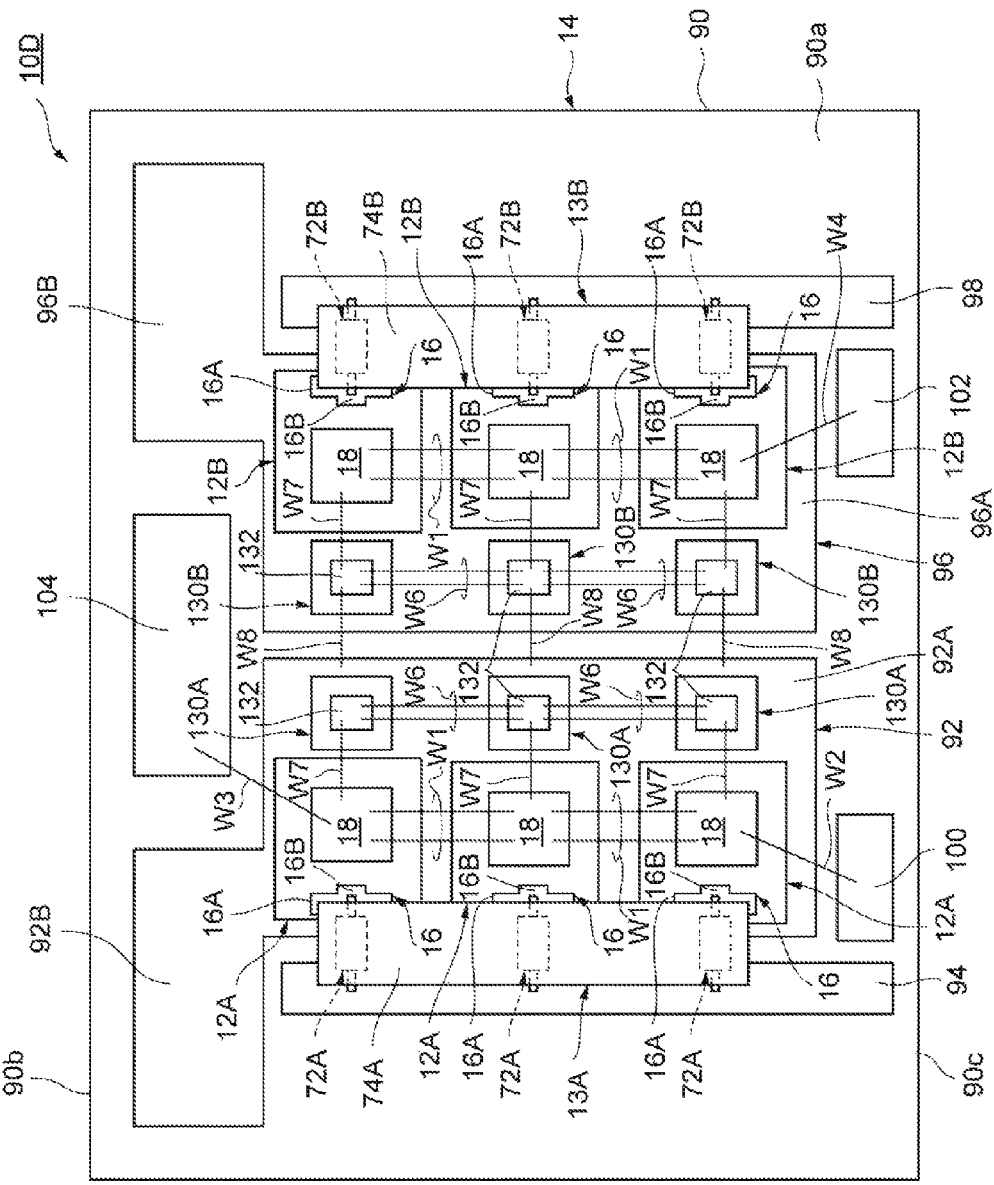
FIG. 14 is a schematic plan view of a semiconductor module according to another embodiment.

A semiconductor module 10D illustrated in FIG. 14 has first and second diode chips 130A, 130B as freewheeling diodes, and the configuration of the semiconductor module 10D corresponds to an embodiment in which the semiconductor module 10A according to the first embodiment has the first and second diode chips 130A, 130B. An example of each of the first and second diode chips 130A, 130B is a schottky barrier diode. The configurations of the first and second diode chips 130A, 130B are the same as each other, and each of the diode chips is a vertical diode having an anode electrode 132 on one surface and a cathode electrode on the other surface (not illustrated).

Each of the first diode chips 130A is mounted on the first chip mounting region 92A so that the cathode electrode of each of the first diode chips 130A faces the first chip mounting region 92A, so that the cathode electrode of each of the first diode chips 130A is connected to the first chip mounting region 92A.

The anode electrodes 132 of adjacent first diode chips 130A are connected together via a sixth wire W6. The anode electrode 132 of each of the plurality of first diode chips 130A is connected to the source electrode pad 18 of the corresponding first transistor chip 12A via the seventh wire W7.

Similarly, each of the second diode chips 130B is mounted on the second chip mounting region 96A so that the cathode electrode of each of the second diode chips 130B faces the second chip mounting region 96A, so that the cathode electrode of each of the second diode chips 130B is connected to the second chip mounting region 96A.

The anode electrodes 132 of the adjacent second diode chips 130B are connected together via the sixth wire W6. The anode electrode 132 of each of the plurality of second diode chips 130B is connected to the source electrode pad 18 of the corresponding second transistor chip 12B via the seventh wire W7.

Further, the anode electrode 132 of each of the second diode chips 130B is connected to the first chip mounting region 92A via an eighth wire W8.

An embodiment has been exemplified in which the semiconductor module 10A according to the first embodiment has the first and second diode chips 130A, 130B; however, the semiconductor module 10C according to the third embodiment may have a diode chip as a freewheeling diode, similarly.

Figure 15:
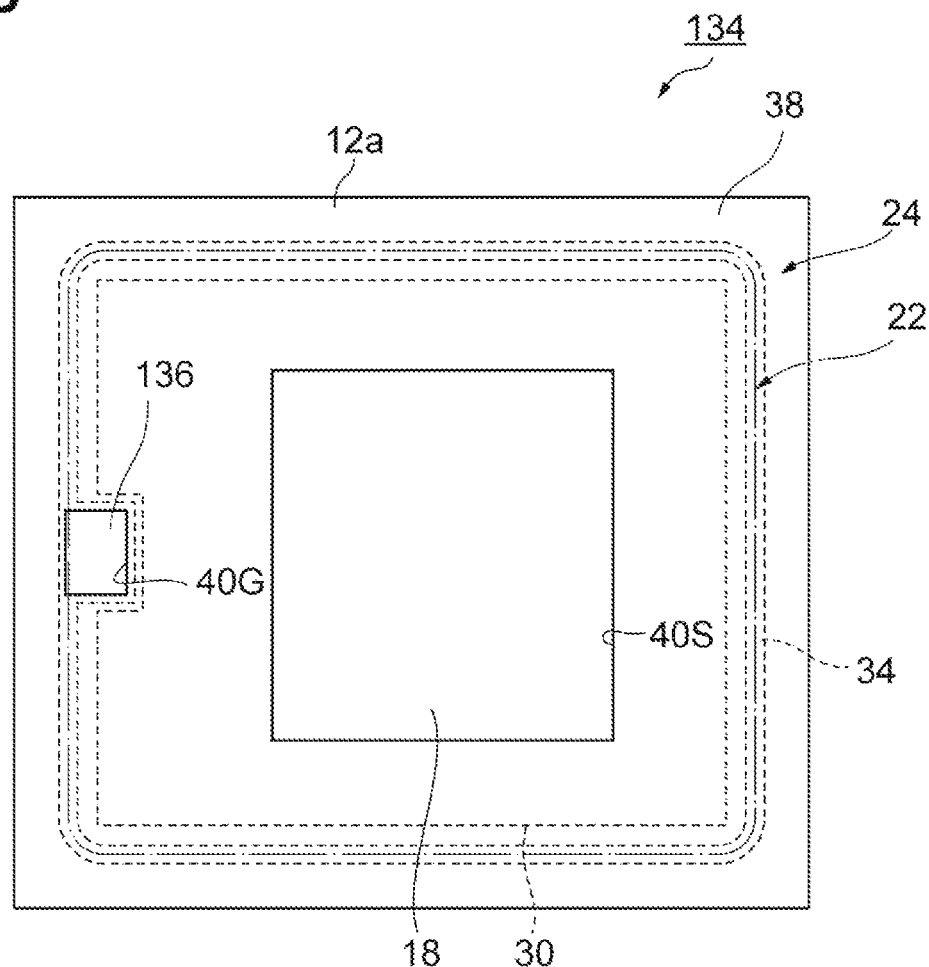
FIG. 15 is a schematic view illustrating a modification of a transistor chip.

In addition, a transistor chip 134 as illustrated in FIG. 15 may be used as each of the first and second transistor chips 12A, 12B in the first embodiment and the transistor chip 12 in the third embodiment. The transistor chip 134 can have a similar configuration other than that a gate electrode pad 136 of the transistor chip 134 does not extend in one direction, different from the gate electrode pad 16 of the transistor chip 12 illustrated in FIG. 3. Since the gate electrode pad 136 does not extend in one direction, different from the gate electrode pad 16, the area of the gate electrode pad 136 is smaller than the area of the gate electrode pad 16.

The configuration of the transistor chip (including the first and second transistor chips) is not limited to the configuration illustrated in FIG. 3 and FIG. 15, and it is sufficient that each transistor chip of the first embodiment and the third embodiment is a transistor having a pair of main electrode pads and a control electrode pad. Therefore, for example, a lateral transistor chip may be used.

In addition, the wiring pattern on which the transistor chip is mounted is formed on the principal surface of the substrate, in the first and third embodiments; however, the transistor chip may be directly joined on the principal surface of the insulating substrate, in an embodiment in which the transistor chip is the lateral transistor chip, for example.

The predetermined direction (first predetermined direction) in which the plurality of first transistor chips 12A is arranged and the predetermined direction (second predetermined direction) in which the plurality of second transistor chips 12B is arranged may be different from each other.

The MOSFET has been exemplified as the transistor chip (including the first and second transistor chips); however, the transistor chip may be an insulated gate bipolar transistor (IGBT), for example. In this case, the embodiment having the diode chips is effective, as illustrated in FIG. 13.

When the transistor chip (including the first and second transistor chips) is the IGBT, the first main electrode pad is an emitter electrode pad, the second main electrode pad is a collector electrode pad, and the control electrode pad is a gate electrode pad.

In the first embodiment, the semiconductor module as a single phase inverter has been exemplified. However, the semiconductor module is not limited to the single phase inverter. For example, it may be three-phase inverter. In this case, it is sufficient that, when the configuration on the front surface 90a of the insulating substrate 90 exemplified in the first embodiment is one unit, three units are formed on the front surface 90a, and the wiring corresponding to the three-phase inverter is performed by using the conducting wire. Incidentally, the first external connection region 92B may be common.

In addition, for example, in the first embodiment, the first resistance part in which the plurality of first resistance elements is linked together by the linking part may be connected in a planar manner to each of the first transistor chips and the like without going through the lead, for example. Similarly, the second resistance part in which the plurality of second resistance elements is linked together by the linking part may be connected in a planar manner to each of the second transistor chips and the like without going through the lead, for example.

In the above description, the wire has been exemplified as the conducting wire used for wiring in the semiconductor module; however, the conducting wire may be a ribbon, for example. Further, it is sufficient that the semiconductor module includes at least one first transistor chip and at least one second transistor chip.

The first to third embodiments and modifications described above may be combined within a scope without departing from the spirit of the present invention.

REFERENCE SIGNS LIST 10A, 10B, 10C . . . Semiconductor module, 12 . . . Transistor chip, 12A . . . First transistor chip, 12B . . . Second transistor chip, 12a . . . Front surface (back surfaces of first and second transistor chips, front surface of transistor chip), 12b . . . Back surface (front surfaces of first and second transistor chips, back surface of transistor chip), 16 . . . Gate electrode pad (control electrode pad), 18 . . . Source electrode pad (first main electrode pad), 20 . . . Drain electrode pad (second main electrode pad), 22 . . . Cell portion, 24 . . . Circumferential portion, 28 . . . Gate electrode (control electrode), 30 . . . Source electrode (first main electrode), 32 . . . Drain electrode (second main electrode), 90 . . . Insulating substrate (substrate), 90a . . . Front surface (principal surface), 92A . . . First chip mounting region (first chip wiring pattern), 94 . . . First gate wiring pattern (first control electrode wiring pattern), 96A . . . Second chip mounting region (second chip wiring pattern), 98 . . . Second gate wiring pattern (second control electrode wiring pattern), 124 . . . Insulating substrate (substrate), 124a . . . Principal surface

The invention claimed is:

1. A semiconductor module comprising:
a substrate;
a plurality of first transistor chips mounted on the substrate; and
a plurality of second transistor chips mounted on the substrate, wherein
each one of the first transistor chips and the second transistor chips has
a first main electrode pad and a second main electrode pad, and
a control electrode pad to which a control voltage is supplied for controlling conduction between the first main electrode pad and the second main electrode pad,
a first control electrode wiring pattern and a second control electrode wiring pattern are formed on a principal surface of the substrate,
the first main electrode pad of each of the plurality of first transistor chips is electrically connected to each other first main electrode pad of the plurality of first transistor chips,
the second main electrode pad of each of the plurality of first transistor chips is electrically connected to each other second main electrode pad of the plurality of first transistor chips,
the first main electrode pad of each of the plurality of second transistor chips is electrically connected to each other first main electrode pad of the plurality of second transistor chips,
the second main electrode pad of each of the plurality of second transistor chips is electrically connected to each other second main electrode pad of the plurality of second transistor chips,
the second main electrode pad of each of the plurality of first transistor chips is electrically connected to the first main electrode pad of each of the plurality of second transistor chips, the control electrode pad of each of the plurality of first transistor chips is connected to the first control electrode wiring pattern via a first resistance part, the control electrode pad of each of the plurality of second transistor chips is connected to the second control electrode wiring pattern via a second resistance part, the first resistance part has a plurality of first resistance elements each of which is connected to the control electrode pad of each of the first transistor chips, and a first linking part linking the plurality of first resistance elements together, and the second resistance part has a plurality of second resistance elements each of which is connected to the control electrode pad of each of the second transistor chips, and a second linking part linking the plurality of the second resistance elements together.

2. The semiconductor module according to claim 1, wherein
the first main electrode pad and the control electrode pad of each of the first transistor chips are formed on a front surface of each of the first transistor chips,
the second main electrode pad of each of the first transistor chips is formed on a back surface of each of the first transistor chips,
the first main electrode pad and the control electrode pad of each of the second transistor chips are formed on a front surface of each of the second transistor chips,
the second main electrode pad of each of the second transistor chips is formed on a back surface of each of the second transistor chips,
a first chip wiring pattern and a second chip wiring pattern are further formed on the principal surface,
each of the plurality of first transistor chips is mounted on the first chip wiring pattern such that the second main electrode pad faces the principal surface, and the second main electrode pad is connected to the first chip wiring pattern,
each of the plurality of second transistor chips is mounted on the second chip wiring pattern such that the second main electrode pad faces the principal surface, and the second main electrode pad is connected to the second chip wiring pattern, and
the first main electrode pad of each of the plurality of second transistor chips is electrically connected to the first chip wiring pattern.

3. The semiconductor module according to claim 1, wherein
the plurality of first transistor chips is arranged in a first predetermined direction on the substrate, and
the control electrode pad of each of the first transistor chips extends in the first predetermined direction.

4. The semiconductor module according to claim 3, wherein
each of the first transistor chips has
a cell portion having a transistor structure including a first main electrode and a second main electrode electrically connected respectively to the first main electrode pad and the second main electrode pad included in each of the first transistor chips, and a control electrode electrically connected to the control electrode pad included in each of the first transistor chips, and
a circumferential portion surrounding the cell portion and electrically protecting the cell portion, and at least a part of the control electrode pad included in each of the first transistor chips is provided on the circumferential portion.

5. The semiconductor module according to claim 1, wherein
the plurality of second transistor chips is arranged in a second predetermined direction on the substrate, and
the control electrode pad of each of the second transistor chips extends in the second predetermined direction.

6. The semiconductor module according to claim 5, wherein
each of the second transistor chips has
a cell portion having a transistor structure including a first main electrode and a second main electrode electrically connected respectively to the first main electrode pad and the second main electrode pad included in each of the second transistor chips, and a control electrode electrically connected to the control electrode pad included in each of the second transistor chips, and
a circumferential portion surrounding the cell portion and electrically protecting the cell portion, and
at least a part of the control electrode pad included in each of the second transistor chip is provided on the circumferential portion.

7. The semiconductor module according to claim 1, wherein
each of the first resistance elements and the corresponding control electrode pad are physically connected together, and
each of the first resistance elements and the first control electrode wiring pattern are physically connected together.

8. The semiconductor module according to claim 1, wherein
each of the second resistance elements and the corresponding control electrode pad are physically connected together, and
each of the second resistance elements and the second control electrode wiring pattern are physically connected together.

9. The semiconductor module according to claim 1, wherein
each one of the first transistor chips and the second transistor chips includes a wide band gap semiconductor.

10. A semiconductor module comprising:
a substrate; and
a plurality of transistor chips mounted on the substrate, wherein
each of the transistor chips has
a first main electrode pad and a second main electrode pad, and
a control electrode pad to which a control voltage is supplied for controlling conduction between the first main electrode pad and the second main electrode pad,
a control electrode wiring pattern is formed on a principal surface of the substrate,
the first main electrode pad of each of the plurality of transistor chips is electrically connected to each other first main electrode pad of the plurality of transistor chips,
the second main electrode pad of each of the plurality of transistor chips is electrically connected to each other second electrode pad of the plurality of transistor chips, the control electrode pad of each of the plurality of transistor chips is connected to the control electrode wiring pattern via a resistance part, and the resistance part has a plurality of resistance elements
each of which is connected to the control electrode pad of each of the transistor chips, and
a linking part linking the plurality of resistance elements together.

11. The semiconductor module according to claim 10, wherein the first main electrode pad and the control electrode pad of each of the transistor chips are formed on a front surface of each of the transistor chips, the second main electrode pad of each of the transistor chips is formed on a back surface of each of the transistor chips, a chip wiring pattern on which the plurality of the transistor chips is mounted is further formed on the principal surface, and each of the plurality of transistor chips is mounted on the chip wiring pattern such that the second main electrode pad faces the principal surface.

12. The semiconductor module according to claim 10, wherein the plurality of transistor chips is arranged in a predetermined direction on the substrate, and the control electrode pad of each of the transistor chips extends in the predetermined direction.

13. The semiconductor module according to claim 12, wherein each of the transistor chips has
a cell portion having a transistor structure including a first main electrode and a second main electrode electrically connected respectively to the first main electrode pad and the second main electrode pad, and
a control electrode electrically connected to the control electrode pad, and
a circumferential portion surrounding the cell portion and electrically protecting the cell portion, and
at least a part of the control electrode pad is provided on the circumferential portion.

14. The semiconductor module according to claim 10, wherein each of the resistance elements and the corresponding control electrode pad are physically connected together, and each of the resistance elements and the control electrode wiring pattern are physically connected together.

15. The semiconductor module according to claim 10, wherein each of the transistor chips includes a wide band gap semiconductor.

* * * * *